(12) United States Patent
Shih et al.

(10) Patent No.: US 10,354,969 B2
(45) Date of Patent: Jul. 16, 2019

(54) SUBSTRATE STRUCTURE, SEMICONDUCTOR PACKAGE INCLUDING THE SAME, AND METHOD FOR MANUFACTURING THE SAME

(71) Applicant: Advanced Semiconductor Engineering, Inc., Kaohsiung (TW)

(72) Inventors: Yu-Lin Shih, Kaohsiung (TW); Chih-Cheng Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/665,289

(22) Filed: Jul. 31, 2017

(65) Prior Publication Data

US 2019/0035753 A1  Jan. 31, 2019

(51) Int. Cl.
*H01L 21/48* (2006.01)
*H01L 23/00* (2006.01)

(52) U.S. Cl.
CPC .......... *H01L 24/14* (2013.01); *H01L 21/4846* (2013.01); *H01L 24/11* (2013.01); *H01L 24/13* (2013.01); *H01L 24/16* (2013.01); *H01L 2224/131* (2013.01); *H01L 2224/16235* (2013.01); *H01L 2224/16238* (2013.01); *H01L 2924/15313* (2013.01)

(58) Field of Classification Search
CPC ...................................................... H01L 24/14
See application file for complete search history.

(56) References Cited

U.S. PATENT DOCUMENTS 9,282,640 B2   3/2016   Kwon et al.
2013/0249083 A1   9/2013   Hu et al.

FOREIGN PATENT DOCUMENTS

TW   M433634   7/2012

*Primary Examiner* — Elias Ullah
(74) *Attorney, Agent, or Firm* — Foley & Lardner LLP; Cliff Z. Liu

(57) ABSTRACT

A substrate structure includes a dielectric layer, a first circuit layer, at least one conductive structure and a first protective layer. The first circuit layer is disposed adjacent to a first surface of the dielectric layer. The conductive structure includes a first portion and a second portion. The first portion is disposed on the first circuit layer. The first protective layer is disposed on the dielectric layer and contacts at least a portion of a sidewall of the first portion of the conductive structure. The first circuit layer and the conductive structure are integrally formed.

18 Claims, 16 Drawing Sheets

SUBSTRATE STRUCTURE, SEMICONDUCTOR PACKAGE INCLUDING THE SAME, AND METHOD FOR MANUFACTURING THE SAME

BACKGROUND

1. Field of the Disclosure

The present disclosure relates to a substrate structure, a semiconductor package and a manufacturing method, and to a substrate structure including an embedded trace substrate (ETS), a semiconductor package including the substrate structure, and a method for manufacturing the substrate structure.

2. Description of the Related Art

Semiconductor chips may be integrated with a large number of electronic components to achieve strong electrical performance. Accordingly, the semiconductor chips are provided with a large number of input/output (I/O) connections. To implement semiconductor packages that use semiconductor chips with a large number of I/O connections, the semiconductor chips and the semiconductor packages may correspondingly be made large. Thus, a cost of manufacture may correspondingly be large. Alternatively, to keep semiconductor packages small while implementing semiconductor chips with a large number of I/O connections, a bonding pad density of semiconductor substrates used for carrying the semiconductor chips may correspondingly be made large. However, in such implementations, formation of bridges between solder on the bonding pads may be an issue of concern.

SUMMARY

In some embodiments, according to an aspect, a substrate structure includes a dielectric layer, a first circuit layer, at least one conductive structure and a first protective layer. The first circuit layer is disposed adjacent to a first surface of the dielectric layer. The conductive structure includes a first portion and a second portion. The first portion is disposed on the first circuit layer. The first protective layer is disposed on the dielectric layer and contacts at least a portion of a sidewall of the first portion of the conductive structure. The first circuit layer and the conductive structure are integrally formed.

In some embodiments, according to another aspect, a semiconductor package includes a substrate structure, a semiconductor die and an encapsulant. The substrate structure includes a dielectric layer, a first circuit layer, at least one conductive structure and a first protective layer. The first circuit layer is disposed adjacent to a first surface of the dielectric layer. The conductive structure includes a first portion and a second portion. The first portion is disposed on the first circuit layer. The first protective layer is disposed on the dielectric layer and contacts at least a portion of a sidewall of the first portion of the conductive structure. The first circuit layer and the conductive structure are integrally formed. The semiconductor die is disposed on the substrate structure and is electrically connected to the second portion of the conductive structure. The encapsulant covers the semiconductor die and the substrate structure.

In some embodiments, according to another aspect, a method for manufacturing a substrate structure includes providing a carrier, and forming a first photoresist, a first protective layer and a second photoresist on the carrier, wherein the first photoresist defines at least one first opening, the first protective layer defines at least one second opening communicating with the first opening of the first photoresist, the second photoresist defines a plurality of circuit openings, and at least one of the circuit openings communicates with the second opening of the first protective layer. The method further includes integrally forming a second portion of a conductive structure, a first portion of the conductive structure and a first circuit layer respectively in the first opening of the first photoresist, the second opening of the first protective layer and the circuit openings of the second photoresist, and removing the carrier and the first photoresist to expose an upper surface and a sidewall of the second portion of the conductive structure.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
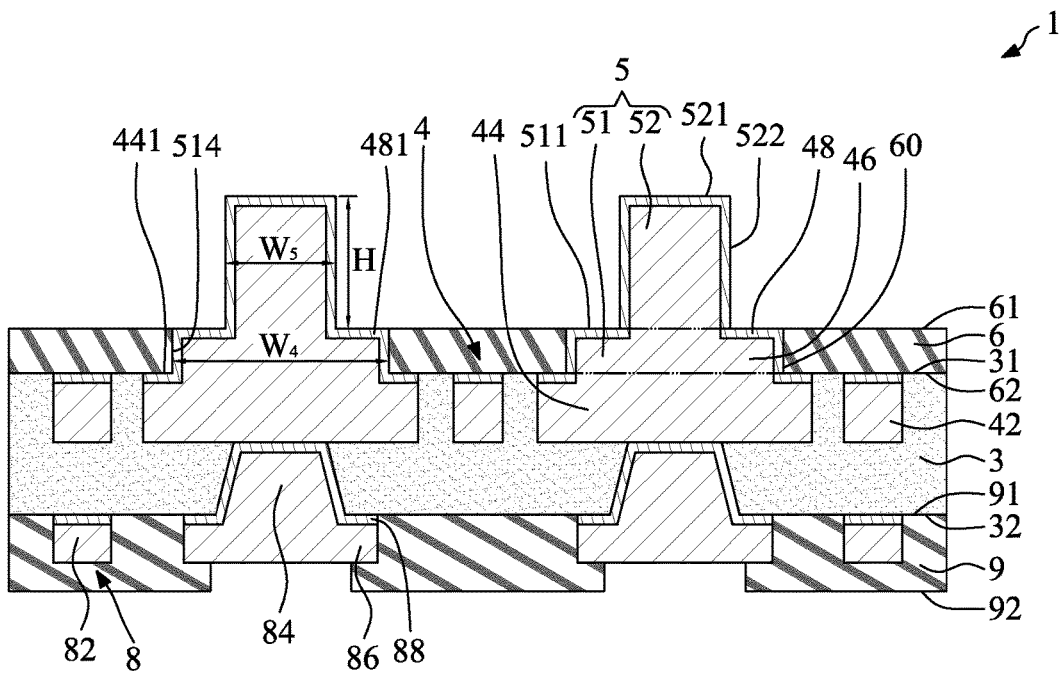
FIG. 1 illustrates a cross-sectional view of some embodiments of a substrate structure according to an aspect of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, reference to the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure disclose a substrate structure including a conductive structure having a first portion and a second portion, a first protective layer contacting at least a part of a sidewall of the first portion of the conductive structure, and a first circuit layer integrally formed with the conductive structure. At least some embodiments of the present disclosure further disclose a semiconductor package including the substrate structure, and techniques for manufacturing the substrate structure.

A substrate structure may be manufactured by the following comparative process. Firstly, a dielectric structure is provided with a circuit layer embedded therein. The circuit layer may include a plurality of bump pads exposed from a surface of the dielectric structure. Then, a plurality of pillars are formed on respective ones of the bump pads of the circuit layer by electroplating. Then, a protective layer is formed to cover the pillars and the circuit layer. Then, a portion of the protective layer is removed by developing or etching to expose a portion of each pillar. The pillar can be connected to the semiconductor chip so as to reduce a volume of solder (or provide for omission of solder) used for electrically connecting the circuit layer to the semiconductor chip, which provides for a low risk of solder bridge formation. However, after removing the portion of the protective layer, a portion of each pillar is still embedded in the protective layer. Hence, an effective height (a height of the exposed portion) of the pillars is reduced. Furthermore, since the protective layer surrounds and contacts the pillars, stress may be accumulated around the pillars, which can result in cracks and peeling of the pillars from the bump pads.

Additionally, since the portion of the protective layer is removed in the manufacturing process, material waste of the protective layer results in increased manufacturing cost. Further, during the developing or etching process, it is difficult to precisely control the thickness of the remained portion of the protective layer, which may result in severe warpage of the substrate structure. Furthermore, non-predictable and variable plating parameters in the plating bath often leads to over-plating or under-plating, which, in turn, results in the top surfaces of the plated pillars not being coplanar. The coplanarity issue can adversely affect the solder joint reliability after packaging. Fine-pitch solder bumps, wafer level packaging (WLP), and large-scale substrates are particularly sensitive to this issue.

The present disclosure provides for a substrate structure including a conductive structure having a first portion and a second portion, a first protective layer contacting at least a part of a sidewall of the first portion of the conductive structure, and a first circuit layer integrally formed with the conductive structure. In some embodiments, the second portion of the conductive structure can be used as a pillar, which is provided with a sufficient height for external connection, such as connection with a semiconductor chip or a semiconductor die. Additionally, since the first portion and the second portion of the conductive structure are integrally formed with the first circuit layer, cracks and peeling between the conductive structure and the first circuit layer can be reduced.

FIG. 1 illustrates a cross-sectional view of some embodiments of a substrate structure 1 according to an aspect of the present disclosure. The substrate structure 1 may be an ETS, and includes a dielectric layer 3, a first circuit layer 4, a first protective layer 6, at least one conductive structure 5, a second circuit layer 8, and a second protective layer 9.

The dielectric layer 3 has a first surface 31 and a second surface 32 opposite to the first surface 31. The dielectric layer 3 may include an insulating material or a dielectric material, such as, for example, polypropylene (PP). It is noted that the dielectric layer 3 may include, or be formed from, other material such as a cured photoimageable dielectric (PID) material such as epoxy or polyimide (PI) including photoinitiators.

The first circuit layer 4 is disposed adjacent to the first surface 31 of the dielectric layer 3. For example, the first circuit layer 4 is embedded in the dielectric layer 3 and exposed from the first surface 31 of the dielectric layer 3. In some embodiments, the first circuit layer 4 is a patterned conductive circuit layer. The first circuit layer 4 includes at least one trace 42 and at least one bump pad 44. The bump pad 44 is connected to the trace 42. In some embodiments, the trace 42 and the bump pad 44 can be formed or disposed concurrently. The bump pad 44 has an upper surface 441 substantially coplanar with the first surface 31 of the dielectric layer 3. In some embodiments, the trace 42 and the bump pad 44 of the first circuit layer 4 may be composed of, or may include, a conductive material 46 and a seed layer 48. The conductive material 46 may include a conductive metal, such as copper, or another metal or combination of metals, and may be formed or disposed by electroplating. The seed layer 48 may include, for example, titanium and/or copper, and may be formed or disposed by sputtering.

The first protective layer 6 is disposed on the first surface 31 of the dielectric layer 3. The first protective layer 6 has a first surface 61 and a second surface 62 opposite to the first surface 61. The second surface 62 of the first protective layer 6 is disposed on (e.g. is in contact with) the first surface 31 of the dielectric layer 3. The first protective layer 6 may cover at least a portion of the first circuit layer 4. For example, as shown in FIG. 1, the first protective layer 6 covers the trace 42 and a portion of the bump pad 44. The first protective layer 6 defines at least one second opening 60 extending through the first protective layer 6. The position of the second opening 60 corresponds to the position of the bump pad 44 of the first circuit layer 4 (e.g. the second opening 60 exposes at least a portion of the bump pad 44). The first protective layer 6 may include a solder resist material, such as, for example, benzocyclobutene (BCB) or polyimide.

Figure 2:
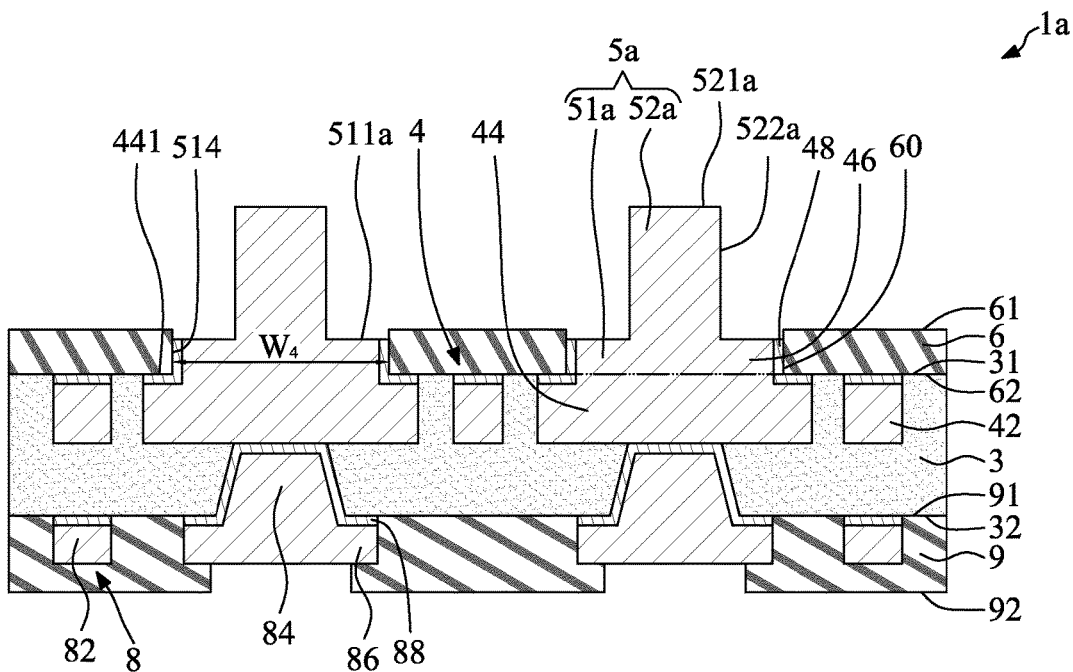
FIG. 2 illustrates a cross-sectional view of some embodiments of a substrate structure according to an aspect of the present disclosure.
Figure 3:
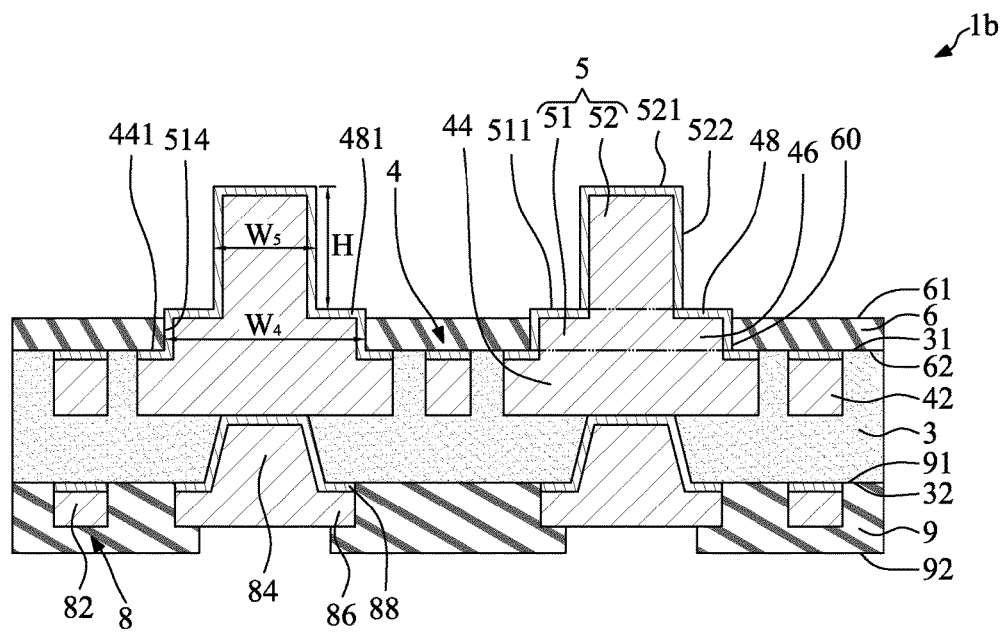
FIG. 3 illustrates a cross-sectional view of some embodiments of a substrate structure according to an aspect of the present disclosure.

The conductive structure 5 is disposed on the first circuit layer 4. The conductive structure 5 includes a first portion 51 and a second portion 52. A minimum width $W_1$ of the first portion 51 of the conductive structure 5 is greater than a minimum width $W_2$ of the second portion 52 of the conductive structure 5. The first portion 51 is disposed on the bump pad 44 of the first circuit layer 4. The first portion 51 has an upper surface 511 and a sidewall 514. In some embodiments, the first portion 51 is disposed in the second opening 60 of the first protective layer 6 so that the first protective layer 6 contacts at least a portion of the sidewall 514 of the first portion 51. In some embodiments, as shown in FIG. 1, the upper surface 511 of the first portion 51 is substantially coplanar with the first surface 61 of the first protective layer 6. A thickness of the first portion 51 may be substantially equal to a thickness of the first protective layer 6. However, in some embodiments, the upper surface 61 of the first protective layer 6 is not at the same level with the upper surface 511 of the first portion 51 (e.g. as shown in FIG. 2 and FIG. 3). The second portion 52 is disposed on the first portion 51 and protrudes from the first surface 61 of the first protective layer 6. The second portion 52 has an upper surface 521 and a sidewall 522. In some embodiments, the first portion 51 and the second portion 52 of the conductive structure 5 are integrally formed. In some embodiments, the first conductive structure 5, including the first portion 51 and the second portion 52, is integrally formed with the first circuit layer 4. For example, the bump pad 44 of the first circuit layer 4 and the first portion 51 and the second portion 52 of the conductive structure 5 are a monolithic structure.

The conductive structure 5 may also include the seed layer 48 and the conductive material 46. For example, the first portion 51 of the conductive structure 5 includes the seed layer 48 and the conductive material 46. The seed layer 48 is disposed between the conductive material 46 and the first protective layer 6. In some embodiments, as shown in FIG. 1, the first portion 51 includes a portion (e.g. a top portion 481) of the seed layer 48 disposed adjacent to the first surface 61 of the first protective layer 6. Accordingly, the upper surface 511 of the first portion 51 is a surface of the top portion 481 of the seed layer 48. In some embodiments, as shown in FIG. 1, the second portion 52 also includes the seed layer 48 and the material 46. In the second portion 52 of the conductive structure 5, the seed layer 48 is exposed and surrounds the conductive material 46. Accordingly, the upper surface 521 and the sidewall 522 of the second portion 52 are surfaces of the seed layer 48.

In some embodiments, as shown in FIG. 1, the substrate structure 1 may include a plurality of conductive structures 5. Each of the second portions 52 of the conductive structures 5 protrudes from the upper surface 61 of the first protective layer 6. The upper surfaces 521 of the second portions 52 of the conductive structures 5 are substantially coplanar. The coplanarity of the upper surfaces 521 of the second portions 52 of the conductive structures 5 may be about ±15 micrometers (μm), about ±7 μm, about ±3 μm, or less. In other words, a deviation in a level of the second portions 52 from a specified height H is within a range of about 15 μm, about 7 μm, about 3 μm, or less of the specified height H, wherein the height H of a given second portion 52 is defined as a distance between the upper surface 521 of the given second portion 52 and the upper surface 61 of the first protective layer 6. Thus, the difference between a greatest value of the heights H of the second portions 52 and a smallest value of the heights H of the second portions 52 is about 30 μm, about 14 μm, about 6 μm, or less. Alternatively, the difference between the greatest value of the heights H of the second portions 52 and the smallest value of the heights H of the second portions 52 may be less than about 5% or about 10% of the specified height H. In some embodiments, the specified height H may be about 60 μm.

In some embodiments, the second circuit layer 8 is a patterned conductive circuit layer. The second circuit layer 8 includes at least one trace 82 and at least one conductive via 84. The trace 82 is disposed on the second surface 32 of the dielectric layer 3. The conductive via 84 is embedded in the dielectric layer 3 and connected to the trace 82. In some embodiments, the trace 82 and the conductive via 84 of the second circuit layer 8 can be formed or disposed concurrently. In some embodiments, the trace 82 and the conductive via 84 of the second circuit layer 8 may include a conductive material 86 and a seed layer 88. The conductive material 86 may include a conductive metal, such as copper, or another metal or combination of metals, and may be formed or disposed by electroplating. The seed layer 88 may include, for example, titanium and/or copper, and may be formed or disposed by sputtering. The conductive material 86 and the seed layer 88 of the second circuit layer 8 may be the same as or different from the conductive material 46 and the seed layer 48 of the first circuit layer 4.

The second protective layer 9 is disposed on the second surface 32 of the dielectric layer 3 and covers at least a portion of the second circuit layer 8. The second protective layer 9 has a first surface 91 and a second surface 92 opposite to the first surface 91. The first surface 91 is disposed on (e.g. is in contact with) the second surface 32 of the dielectric layer 3. A portion of the second circuit layer 8 (e.g. a bonding pad) is exposed from the second surface 92 of the second protective layer 9. The second protective layer 9 may include a solder resist material, for example, benzocyclobutene or polyimide. The material of the second protective layer 9 may be the same as or different from the material of the first protective layer 6.

Figure 6:
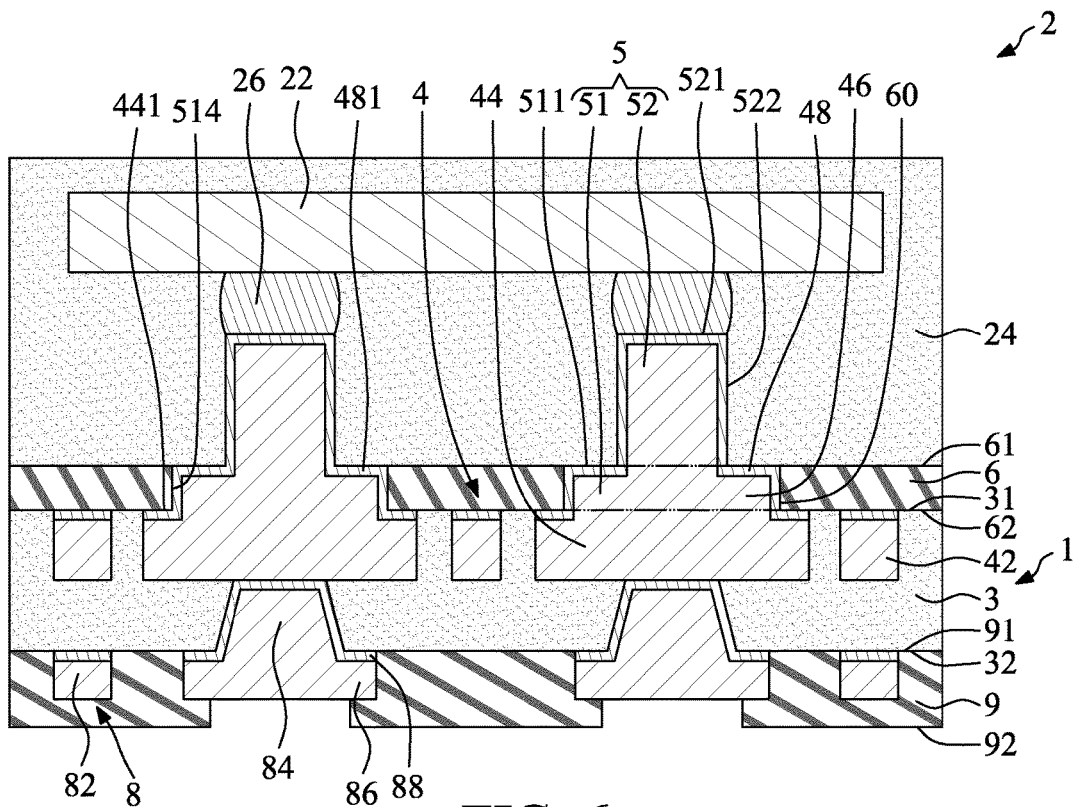
FIG. 6 illustrates a cross-sectional view of some embodiments of a semiconductor package according to an aspect of the present disclosure.

In the substrate structure 1, the second portion 52 of the conductive structure 5 can be used as a pillar for external connection, such as connection with a semiconductor die 22 (e.g. as shown in FIG. 6). Since the second portion 52 protrudes from the first protective layer 6, the second portion 52 is provided with sufficient height for external connection, in some implementations. Additionally, since the first portion 51 and the second portion 52 of the conductive structure 5 are integrally formed with the first circuit layer 4, stress accumulated around the second portion 52 can be reduced or dispersed. Thus, cracks and peeling between the conductive structure 5 and the first circuit layer 4 can be avoided. Furthermore, since the upper surfaces 521 of the second portions 52 of the conductive structures 5 are substantially coplanar, the solder joint reliability issues after packaging, as discussed above, can be avoided.

FIG. 2 illustrates a cross-sectional view of some embodiments of a substrate structure 1a according to an aspect of the present disclosure. The substrate structure 1a is similar to the substrate structure 1 shown in FIG. 1, except that the arrangement of the seed layer 48 in the conductive structure 5a of the substrate structure 1a differs from that of the conductive structure 5 of the substrate structure 1 shown in FIG. 1. The conductive structure 5a of the substrate structure 1a also includes a first portion 51a and a second portion 52a, which are similar to the first portion 51 and the second portion 52 of the conductive structure 5 of the substrate structure 1. The first portion 51a includes the seed layer 48 and the conductive material 46. The seed layer 48 is disposed between the conductive material 46 and the first protective layer 6. However, the top portion 481 of the seed layer 48 of the substrate structure 1 shown in FIG. 1 is omitted in the substrate structure 1a shown in FIG. 2. Accordingly, the upper surface 511a of the first portion 51a in the substrate structure 1a shown in FIG. 2 is a surface of the conductive material 46. Similarly, the seed layer 48 is omitted in the second portion 52 of the substrate structure 1a shown in FIG. 2, and the upper surface 521a and the sidewall 522a are surfaces of the conductive material 46. As shown in FIG. 2, the upper surface 61 of the first protective layer 6 is not at a same level as the upper surface 511a of the first portion 51a. The upper surface 61 of the first protective layer 6 is higher than the upper surface 511a of the first portion 51a of the conductive structure 5a. The upper surface 511a of the first portion 51a of the conductive structure 5a is recessed from the upper surface 61 of the first protective layer 6.

FIG. 3 illustrates a cross-sectional view of some embodiments of a substrate structure 1b according to an aspect of the present disclosure. The substrate structure 1b is similar to the substrate 1 shown in FIG. 1, except that the relative position of the conductive structure 5 and the first protective layer 6 of the substrate structure 1b differ from that of the substrate structure 1 shown in FIG. 1. As shown in FIG. 3, the upper surface 61 of the first protective layer 6 is not at the same level with the upper surface 511 of the first portion 51. For example, the upper surface 61 of the first protective layer 6 is lower than the upper surface 511 of the first portion 51 of the conductive structure 5. The upper surface 61 of the first protective layer 6 is recessed from the upper surface 511 of the first portion 51 of the conductive structure 5.

Figure 4:
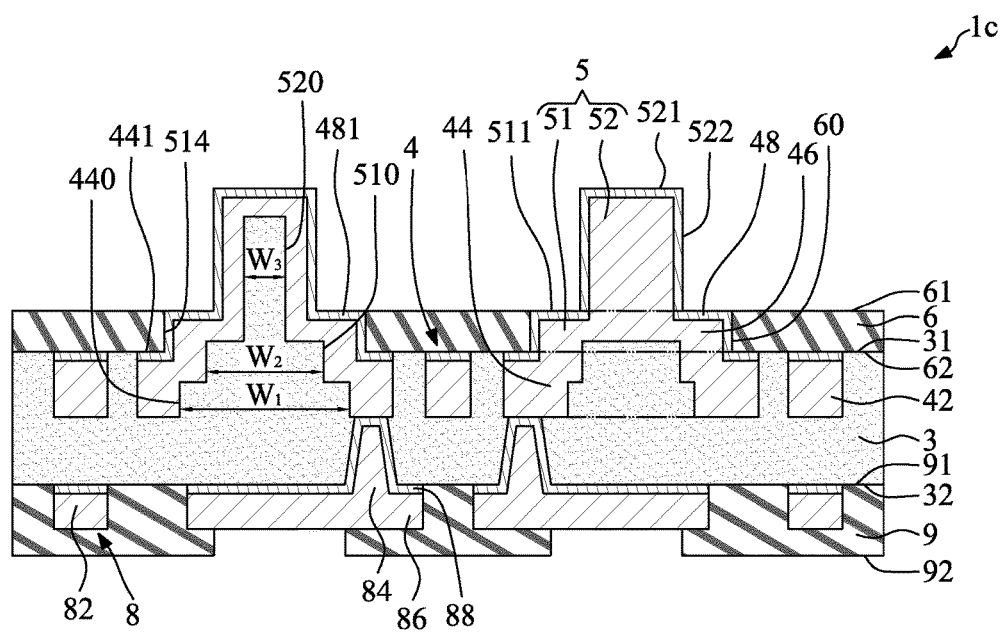
FIG. 4 illustrates a cross-sectional view of some embodiments of a substrate structure according to an aspect of the present disclosure.

FIG. 4 illustrates a cross-sectional view of some embodiments of a substrate structure 1c according to an aspect of the present disclosure. The substrate structure 1c is similar to the substrate structure 1 shown in FIG. 1, except that the bump pad 44 of the first circuit layer 4, the first portion 51 of conductive structure 5, and the second portion 52 of conductive structure 5 of the substrate structure 1c may further define at least one first hole 440, at least one second hole 510, and at least one third hole 520, respectively.

As shown in FIG. 4, the bump pad 44 of the first circuit layer 4 defines the first hole 440. The first hole 440 has a minimum width $W_3$. The dielectric layer 3 substantially fills the first hole 440. The first portion 51 of the conductive structure 5 defines the second hole 510 which communicates with the first hole 440 of the bump pad 44 of the first circuit layer 4. The second hole 510 has a minimum width $W_4$. The minimum width $W_3$ of the first hole 440 of the bump pad 44 of the first circuit layer 4 is greater than the minimum width $W_4$ of the second hole 510 of the first portion 51 of the conductive structure 5. The dielectric layer 3 substantially fills the second hole 510. The second portion 52 of the conductive structure 5 defines the third hole 520 which communicates with the second hole 510 of the first portion 51 of the conductive structure 5. The third hole 520 has a minimum width $W_5$. The dielectric layer 3 substantially fills the third hole 520. The minimum width $W_4$ of the second hole 510 of the first portion 51 of the conductive structure 5 is greater than the minimum width $W_5$ of the third hole 520 of the second portion 52 of the conductive structure 5. In some embodiments, sidewalls of the first hole 440, the second hole 510 and the third hole 520 may be continuous and smooth. For example, the first hole 440, the second hole 510 and the third hole 520 may be substantially in a tapered shape (e.g. a shape having a substantially constant angle of taper).

Figure 5:
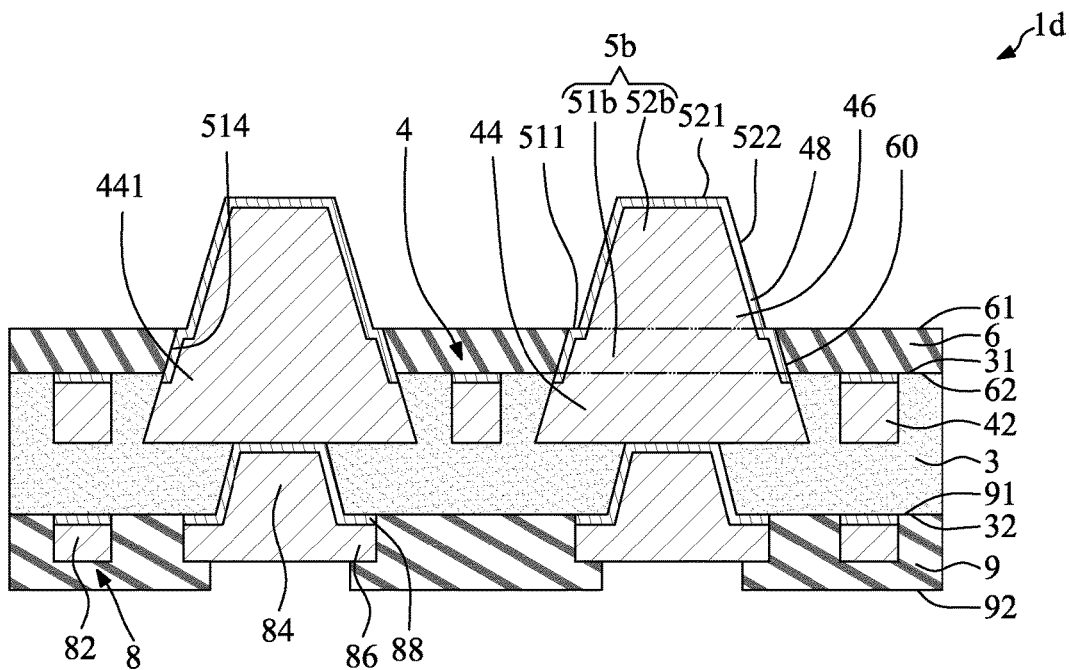
FIG. 5 illustrates a cross-sectional view of some embodiments of a substrate structure according to an aspect of the present disclosure.

FIG. 5 illustrates a cross-sectional view of some embodiments of a substrate structure 1d according to an aspect of the present disclosure. The substrate structure 1d is similar to the substrate structure 1 shown in FIG. 1, except that the bump pad 44 of the first circuit layer 4, the first portion 51b of the conductive structure 5b, and the second portion 52b of the conductive structure 5b are substantially in a tapered shape. For example, as shown in FIG. 5, the bump pad 44 of the first circuit layer 4, the first portion 51b of the conductive structure 5b, and the second portion 52b of the conductive structure 5b are in substantially trapezoidal shapes.

FIG. 6 illustrates a cross-sectional view of some embodiments of a semiconductor package 2 according to an aspect of the present disclosure. The semiconductor package 2 includes a substrate structure 1, a semiconductor die 22, and an encapsulant 24.

The substrate structure 1 is similar to the substrate structure 1 shown in FIG. 1. The semiconductor die 22 is disposed on the substrate structure 1 and electrically connected to the second portion 52 of the conductive structure 5. For example, the semiconductor die 22 may be connected to the second portion 52 of the conductive structure 5 through a solder component 26. The encapsulant 24, such as a molding compound, covers the semiconductor die 22 and the substrate structure 1. In some embodiments, the substrate structure 1 of the semiconductor package 2 can be replaced by the substrate structures 1*a*, 1*b*, 1*c* and/or 1*d* shown in FIG. 2, FIG. 3, FIG. 4, and FIG. 5, respectively.

FIG. 7, FIG. 8, FIG. 9, FIG. 10, FIG. 11, FIG. 12, FIG. 13, FIG. 14, FIG. 15, and FIG. 16 illustrate a method for manufacturing a substrate structure according to some embodiments of the present disclosure. In some embodiments, the method is for manufacturing a substrate structure such as the substrate structure 1 shown in FIG. 1.

Figure 7:
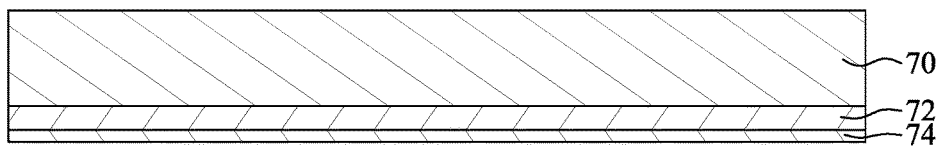
FIG. 7 illustrates one or more stages of an example of a method for manufacturing a substrate structure according to some embodiments of the present disclosure.

Referring to FIG. 7, a carrier 70, a first metal layer 72 and a second metal layer 74 are provided. The first metal layer 72 may include a copper foil and is pressed on or adhered to the carrier 70. The second metal layer 74 may also be a copper foil and is adhered to the first metal layer 72. In some embodiments, a thickness of the first metal layer 72 may differ from a thickness of the second metal layer 74. For example, the thickness of the first metal layer 72 may be about 18 μm, and the thickness of the second metal layer 74 may be about 3 μm.

Figure 8:
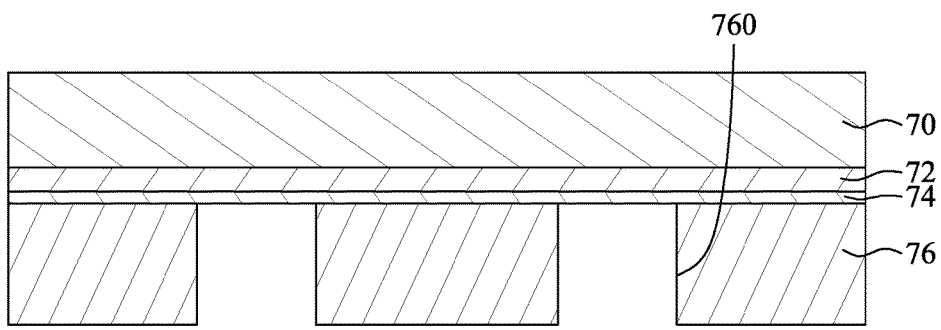
FIG. 8 illustrates one or more stages of an example of a method for manufacturing a substrate structure according to some embodiments of the present disclosure.

Referring to FIG. 8, a first photoresist 76 is formed or disposed on the carrier 70. The first photoresist 76 may include a dry film. The first photoresist 76 defines at least one first opening 760. The first opening 760 extends through the first photoresist 76. The first photoresist 76 may include a photo-imageable material, and the first opening 760 may be patterned by a lithography technique.

Figure 9:
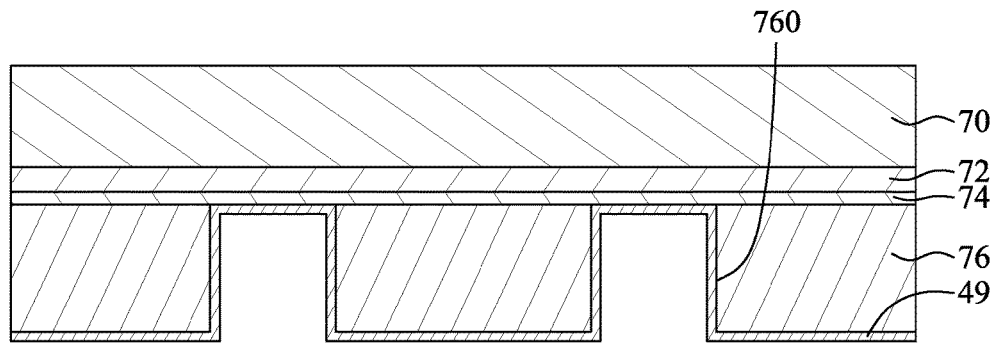
FIG. 9 illustrates one or more stages of an example of a method for manufacturing a substrate structure according to some embodiments of the present disclosure.

Referring to FIG. 9, an auxiliary seed layer 49 is formed or disposed on the first photoresist 76 and in the first opening 760 of the first photoresist 76. The auxiliary seed layer 49 may include, for example, titanium and/or copper, and may be formed or disposed by sputtering.

Figure 10:
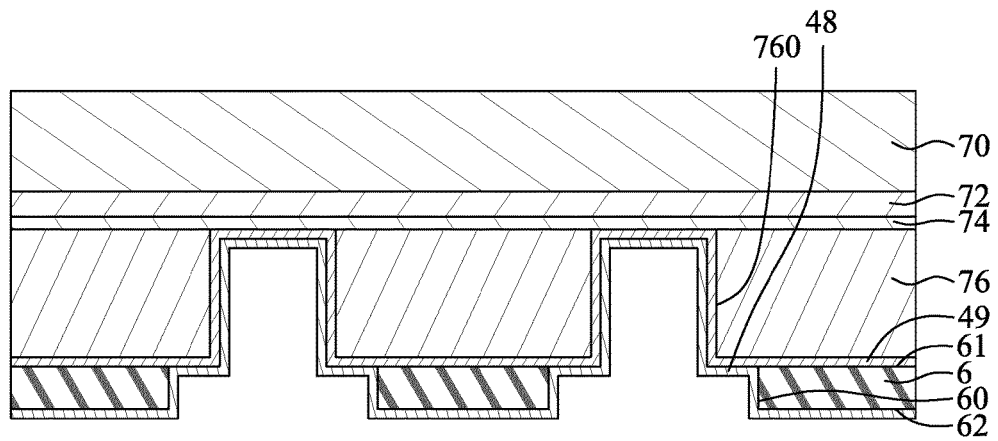
FIG. 10 illustrates one or more stages of an example of a method for manufacturing a substrate structure according to some embodiments of the present disclosure.

Referring to FIG. 10, a first protective layer 6 is formed or disposed on the first photoresist 76 and the auxiliary seed layer 49. The first protective layer 6 has a first surface 61 and a second surface 62 opposite to the first surface 61. The first surface 61 of the first protective layer 6 is disposed on the first photoresist 76. The first protective layer 6 may include a solder resist material, for example, BCB or PI, and may be of a film type. The first protective layer 6 defines at least one second opening 60, which communicates with the first opening 760 of the first photoresist 76. The second opening 60 extends through the first protective layer 6. Then, a seed layer 48 is formed or disposed on the first protective layer 6, and in the second opening 60 of the first protective layer 6 and the first opening 760 of the first photoresist 76. For example, the seed layer 48 is formed on the auxiliary seed layer 49 in the second opening 60 of the first protective layer 6 and in the first opening 760 of the first photoresist 76. The seed layer 48 may include, for example, titanium and/or copper, and may be formed or disposed by sputtering. The material of the seed layer 48 may be the same as or different from the material of the auxiliary seed layer 49.

Figure 11:
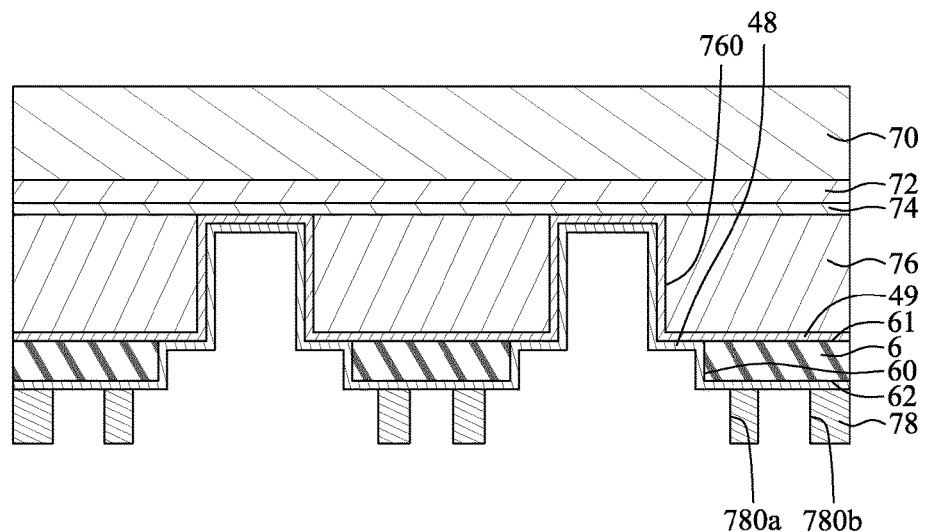
FIG. 11 illustrates one or more stages of an example of a method for manufacturing a substrate structure according to some embodiments of the present disclosure.

Referring to FIG. 11, a second photoresist 78 is formed on the first protective layer 6 and the seed layer 48. The second photoresist 78 may include a dry film. The second photoresist 78 defines a plurality of circuit openings (e.g., circuit openings 780*a* and 780*b*). The circuit openings (e.g., the circuit openings 780*a* and 780*b*) extend through the second photoresist 78. At least one of the circuit openings (e.g., the circuit opening 780*a*) communicates with the second openings 60 of the first protective layer 6. In some embodiments, another one of the circuit openings (e.g., the circuit opening 780*b*) does not communicate with the second openings 60 of the first protective layer 6. The second photoresist 78 may include a photo-imageable material, and the circuit openings (e.g., the circuit openings 780*a* and 780*b*) may be patterned by a lithography technique. The material of the second photoresist 78 may be the same as or different from the material of the first photoresist 76.

Figure 12:
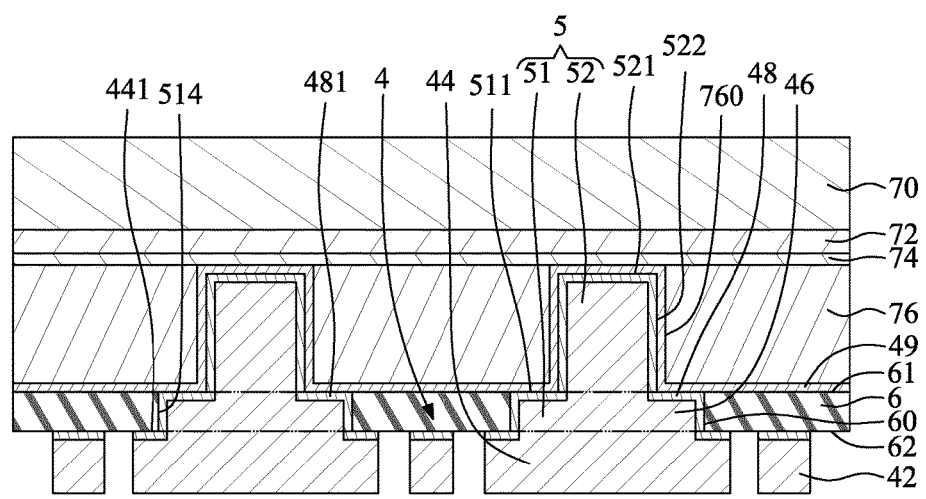
FIG. 12 illustrates one or more stages of an example of a method for manufacturing a substrate structure according to some embodiments of the present disclosure.

Referring to FIG. 12, a second portion 52 of a conductive structure 5, a first portion 51 of the conductive structure 5 and a first circuit layer 4 are integrally formed in the first opening 760 of the first photoresist 76, the second opening 60 of the first protective layer 6 and the circuit openings (e.g., the circuit openings 780*a* and 780*b*) of the second photoresist 78, respectively. For example, a conductive material 46 is filled in the first opening 760 of the first photoresist 76, the second opening 60 of the first protective layer 6 and the circuit openings (e.g., the circuit openings 780*a* and 780*b*) of the second photoresist 78 by electroplating. Accordingly, the second portion 52 of the conductive structure 5 is formed in the first opening 760 of the first photoresist 76, and the first portion 51 of the conductive structure 5 is formed in the second opening 60 of the first protective layer 6. The first protective layer 6 contacts at least a portion of the sidewall 514 of the first portion 51.

Then, the second photoresist 78 is removed by, for example, stripping. Portions of the seed layer 48 which are not covered by the conductive material 46 are then removed by, for example, etching. The first circuit layer 4 is thus formed. The first circuit layer 4 includes a trace 42 and a bump pad 44. The trace 42 is formed corresponding to the circuit opening 780*b* which does not communicate with the second opening 60 of the first protective layer 6. The bump pad 44 is formed corresponding to the circuit opening 780*a* which communicates with the second opening 60 of the first protective layer 6. The bump pad 44 has an upper surface 441 contacting the second surface 62 of the first protective layer 6. The first portion 51 has an upper surface 511 and a sidewall 514. The second portion 52 has an upper surface 521 and a sidewall 522. In some embodiments, as shown in FIG. 12, the first portion 51 includes a top portion 481 of the seed layer 48 disposed adjacent to the first surface 61 of the first protective layer 6. In the second portion 52 of the conductive structure 5, the seed layer 48 surrounds the conductive material 46.

Figure 13:
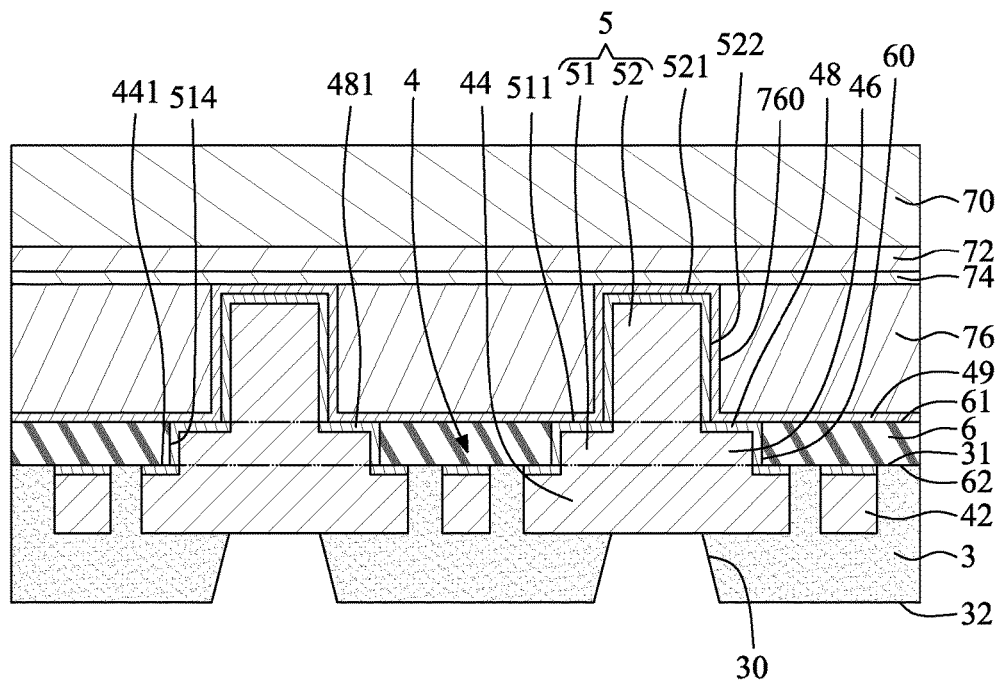
FIG. 13 illustrates one or more stages of an example of a method for manufacturing a substrate structure according to some embodiments of the present disclosure.

Referring to FIG. 13, a dielectric layer 3 is formed or disposed on and covers the first protective layer 6 and the first circuit layer 4 by, for example, lamination. The dielectric layer 3 may include an insulating material or a dielectric material, such as, for example, polypropylene. It is noted that the dielectric layer 3 may include, or be formed from, a cured photoimageable dielectric material such as epoxy or polyimide including photoinitiators. The dielectric layer 3 has a first surface 31 and a second surface 32 opposite to the first surface 31. The first surface 31 of the dielectric layer 3 is disposed on the second surface 62 of the first protective layer 6. The dielectric layer 3 defines an opening 30 that exposes at least a portion of the bump pad 44 of the first circuit layer 4. The opening 30 of the dielectric layer 3 may be formed by, for example, laser drilling.

Figure 14:
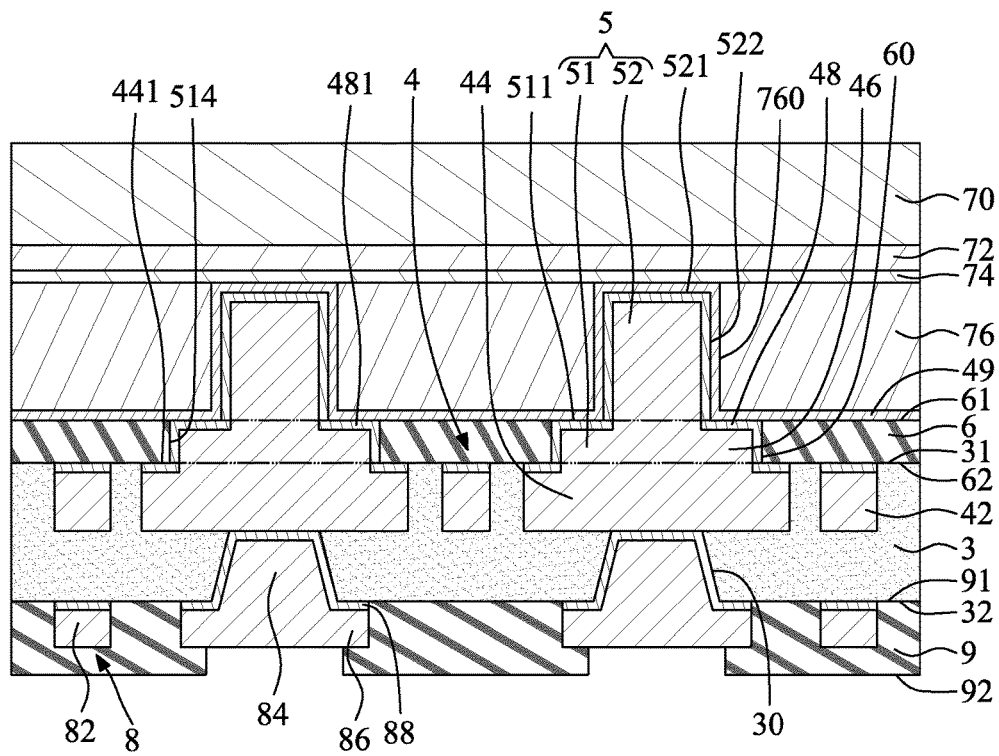
FIG. 14 illustrates one or more stages of an example of a method for manufacturing a substrate structure according to some embodiments of the present disclosure.

Referring to FIG. 14, a second circuit layer 8 is formed on the dielectric layer 3 and in the opening 30 of the dielectric layer 3. The second circuit layer 8 includes a trace 82 and a conductive via 84. The conductive via 84 is formed or disposed in the opening 30 of the dielectric layer 3, and is connected to the bump pad 44 of the first circuit layer 4. In some embodiments, forming the trace 82 and the conductive via 84 of the second circuit layer 8 may include forming a seed layer 88 and a conductive material 86 on the seed layer 88. The seed layer 88 may include, for example, titanium and/or copper, and may be formed or disposed by sputtering. The conductive material 86 may include a conductive metal, such as copper, or another metal or combination of metals, and may be formed or disposed by electroplating. Then, a second protective layer 9 is formed on the second surface 32 of the dielectric layer 3 and covers at least a portion of the second circuit layer 8. The second protective layer 9 has a first surface 91 and a second surface 92 opposite to the first surface 91. The first surface 91 is disposed on the second surface 32 of the dielectric layer 3. A portion of the conductive via 84 of the second circuit layer 8 is exposed from the second surface 92 of the second protective layer 9. The second protective layer 9 may include a solder resist material, for example, benzocyclobutene or polyimide. The material of the second protective layer 9 may be the same as or different from the material of the first protective layer 6.

Figure 15:
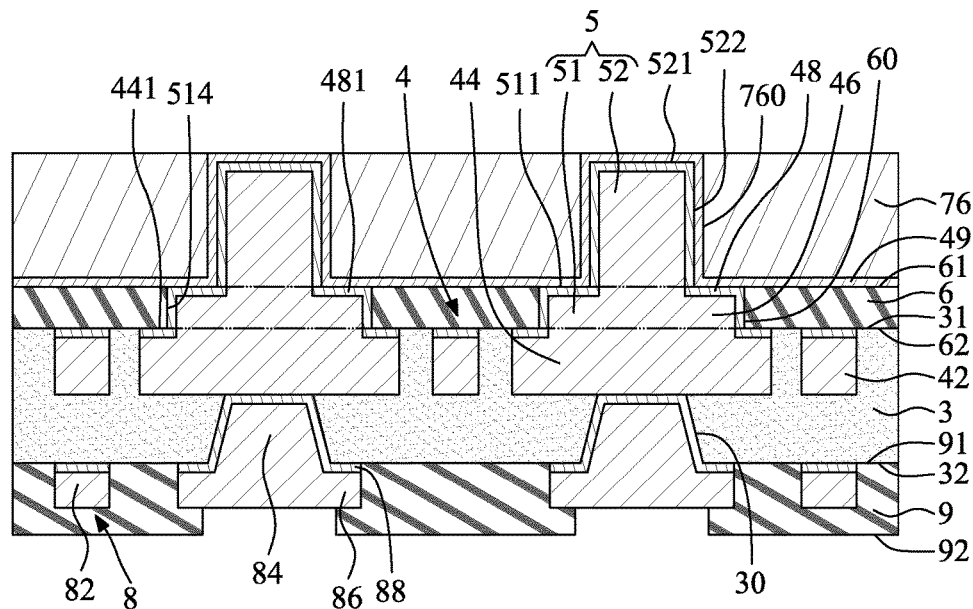
FIG. 15 illustrates one or more stages of an example of a method for manufacturing a substrate structure according to some embodiments of the present disclosure.

Referring to FIG. 15, the carrier 70 is removed by, for example, stripping. Then, the first metal layer 72 and the second metal layer 74 are removed by, for example, etching, chemical mechanical polishing (CMP) and/or grinding.

Figure 16:
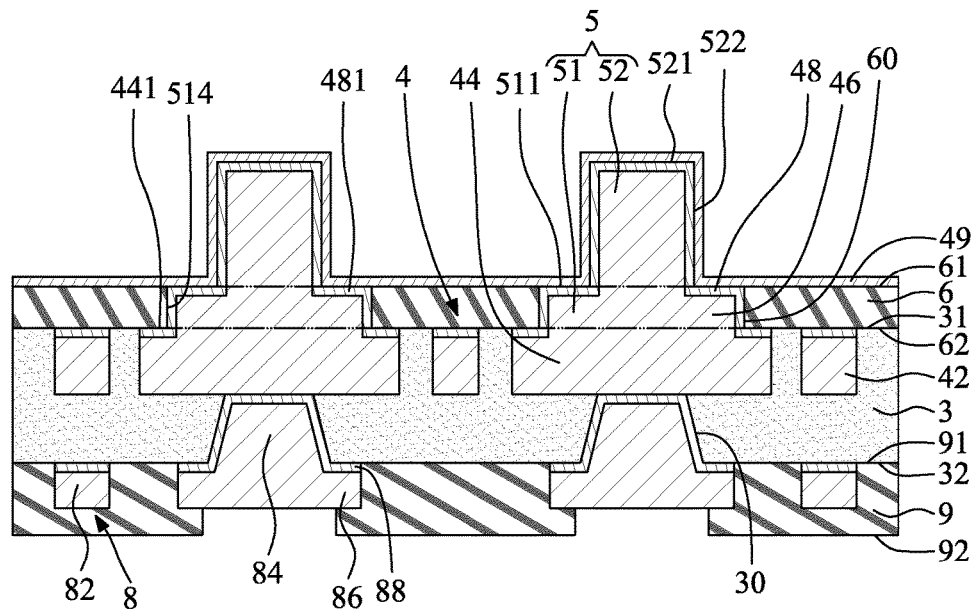
FIG. 16 illustrates one or more stages of an example of a method for manufacturing a substrate structure according to some embodiments of the present disclosure.

Referring to FIG. 16, the first photoresist 76 is removed by, for example, stripping. Then, an etching process is conducted to remove the auxiliary seed layer 49 on the first protective layer 6 and on the conductive structure 5, to expose the upper surface 521 and the sidewall 522 of the second portion 52 of the conductive structure 5, the upper surface 511 of the first portion 51 of the conductive structure 5, and the first surface 61 of the first protective layer 6. The substrate structure 1 as shown in FIG. 1 is thus formed. The first portion includes the top portion 481 of the seed layer 48 disposed adjacent to the first surface 61 of the first protective layer 6. Accordingly, the upper surface 511 of the first portion 51 is a surface of the top portion 481 of the seed layer 48. The upper surface 511 of the first portion 51 is substantially coplanar with the first surface 61 of the first protective layer 6. In the second portion 52 of the conductive structure 5, the seed layer 48 is exposed and surrounds the conductive material 46. Accordingly, the upper surface 521 and the sidewall 522 are surfaces of the seed layer 48. The second portion 52 protrudes from the first surface 61 of the first protective layer 6.

In the manufacturing method described above, since the first protective layer 6 is formed before the formation of the conductive structure 5, there is no need to remove a portion of the first protective layer 6 for exposing the second portion 52 of the conductive structure 5. Hence, material waste of the first protective layer 6 can be reduced. Additionally, the thickness of the first protective layer 6 can be provided with a desired thickness, thus avoiding warpage of the substrate structure 1. In addition, the second portions 52 of the conductive structures 5 are formed such that they abut the second metal layer 74 (as shown in FIG. 9, FIG. 10, FIG. 11, and FIG. 12), and thus, the upper surfaces 521 of the second portions 52 of the conductive structures 5 are substantially coplanar. As discussed above, the coplanarity of the upper surfaces 521 of the second portions 52 of the conductive structures 5 may be about ±15 μm, about ±7 μm, about ±3 μm, or less.

However, in some embodiments, during the etching process for removing the auxiliary seed layer 49, a portion of the seed layer 48 may also be removed. Accordingly, a substrate structure 1a is formed as shown in FIG. 2. That is, the top portion 481 of the seed layer 48 is removed. Accordingly, the upper surface 511a of the first portion 51a is a surface of the conductive material 46. Hence, the upper surface 61 of the first protective layer 6 may be higher than the upper surface 511a of the first portion 51a of the conductive structure 5a.

Figure 17:
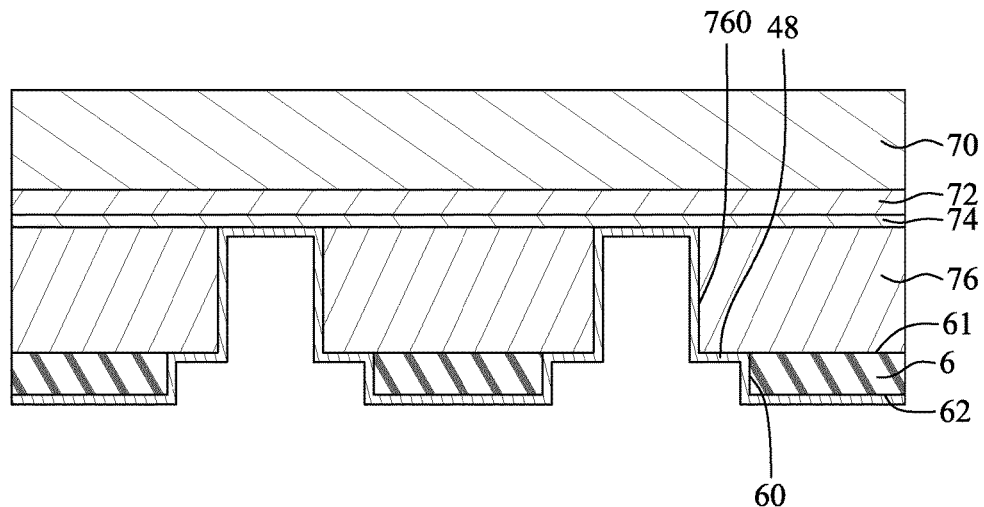
FIG. 17 illustrates one or more stages of an example of a method for manufacturing a substrate structure according to some embodiments of the present disclosure.

FIG. 17, FIG. 18, FIG. 19, FIG. 20, FIG. 21, and FIG. 22 illustrate a method for manufacturing a substrate structure according to some embodiments of the present disclosure. In some embodiments, the method is for manufacturing a substrate structure such as the substrate structure 1b shown in FIG. 3. The initial stages of the illustrated process are the same as the stages illustrated in FIG. 7 and FIG. 8. FIG. 17 depicts a stage subsequent to that depicted in FIG. 8. Referring to FIG. 17, a first protective layer 6 is formed directly on and contacts the first photoresist 76. That is, the stage for forming the auxiliary seed layer 49 as shown in FIG. 9 is omitted. The first protective layer 6 may include a solder resist material, for example, BCB or PI. The first protective layer 6 defines at least one second opening 60, which communicates with the first opening 760 of the first photoresist 76. The second opening 60 extends through the first protective layer 6. Then, a seed layer 48 is formed or disposed on the first protective layer 6, and in the second opening 60 of the first protective layer 6 and the first opening 760 of the first photoresist 76. The seed layer 48 may include, for example, titanium and/or copper, and may be formed or disposed by sputtering.

Figure 18:
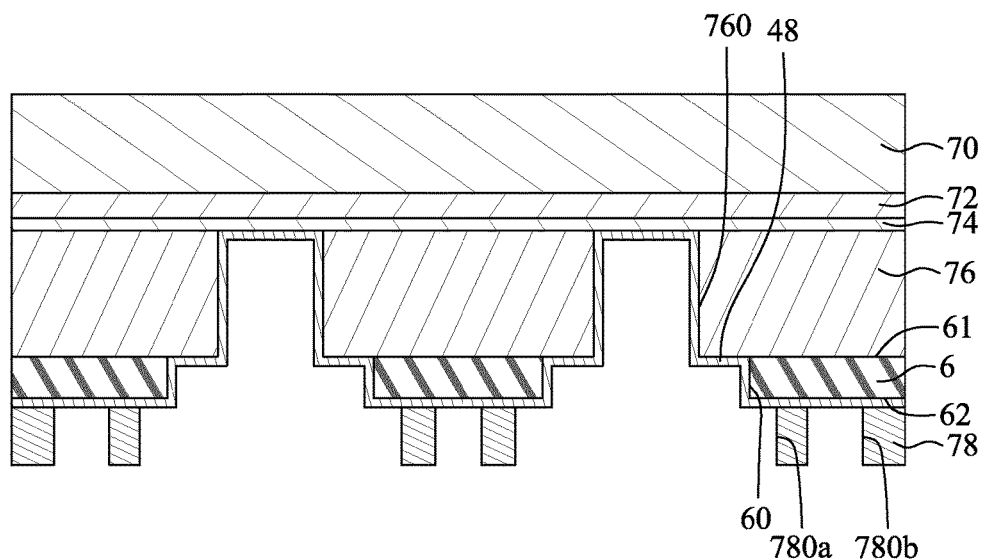
FIG. 18 illustrates one or more stages of an example of a method for manufacturing a substrate structure according to some embodiments of the present disclosure.

Referring to FIG. 18, a second photoresist 78 is formed on the first protective layer 6 and the seed layer 48. The second photoresist 78 may include a dry film. The second photoresist 78 defines a plurality of circuit openings (e.g., circuit openings 780a and 780b). The circuit openings (e.g., the circuit openings 780a and 780b) extend through the second photoresist 78. At least one of the circuit openings (e.g., the circuit opening 780a) communicates with the second openings 60 of the first protective layer 6. In some embodiments, another one of the circuit openings (e.g., the circuit opening 780b) does not communicate with the second openings 60 of the first protective layer 6. The second photoresist 78 may include a photo-imageable material, and the circuit openings (e.g., the circuit openings 780a and 780b) may be patterned by a lithography technique.

Figure 19:
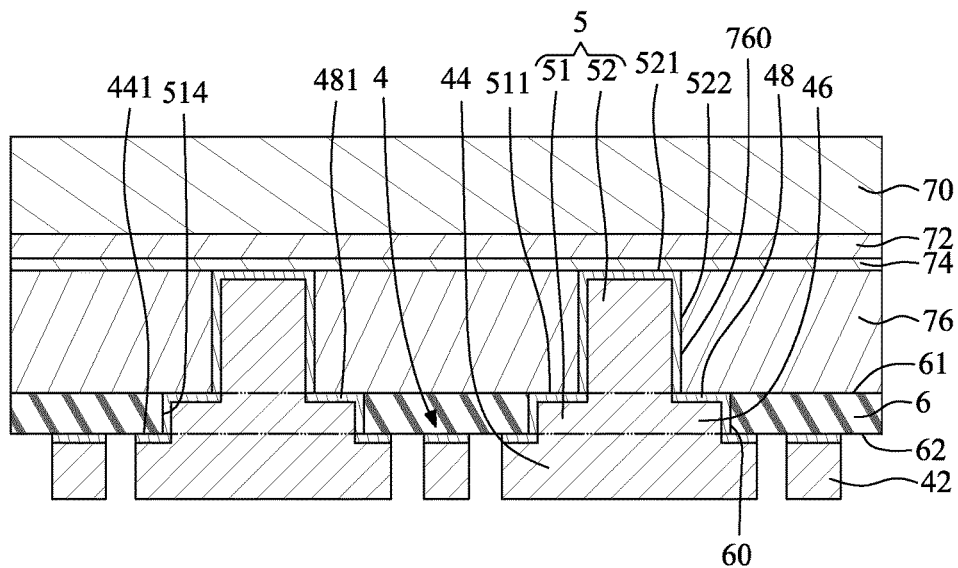
FIG. 19 illustrates one or more stages of an example of a method for manufacturing a substrate structure according to some embodiments of the present disclosure.

Referring to FIG. 19, a second portion 52 of a conductive structure 5, a first portion 51 of the conductive structure 5 and a first circuit layer 4 are integrally formed in the first opening 760 of the first photoresist 76, the second opening 60 of the first protective layer 6 and the circuit openings (e.g., the circuit openings 780a and 780b) of the second photoresist 78, respectively. For example, a conductive material 46 is filled in the first opening 760 of the first photoresist 76, the second opening 60 of the first protective layer 6 and the circuit openings (e.g., the circuit openings 780a and 780b) of the second photoresist 78 by electroplating. Accordingly, the second portion 52 of the conductive structure 5 is formed in the first opening 760 of the first photoresist 76, and the first portion 51 of the conductive structure 5 is formed in the second opening 60 of the first protective layer 6. The first protective layer 6 contacts at least a portion of the sidewall 514 of the first portion 51.

Then, the second photoresist 78 is removed by, for example, stripping. Portions of the seed layer 48 which are not covered by the conductive material 46 are then removed by, for example, etching. The first circuit layer 4 is thus formed. The first circuit layer 4 includes a trace 42 and a bump pad 44. The trace 42 is formed corresponding to the circuit opening 780b which does not communicate with the second opening 60 of the first protective layer 6. The bump pad 44 is formed corresponding to the circuit opening 780a which communicates with the second opening 60 of the first protective layer 6. The bump pad 44 has an upper surface 441 contacting the second surface 62 of the first protective layer 6. The first portion 51 has an upper surface 511 and a sidewall 514. The second portion 52 has an upper surface 521 and a sidewall 522. In some embodiments, as shown in FIG. 19, the first portion includes the top portion 481 of the seed layer 48 disposed adjacent to the first surface 61 of the first protective layer 3. In the second portion 52 of the conductive structure 5, the seed layer 48 surrounds the conductive material 46.

Figure 20:
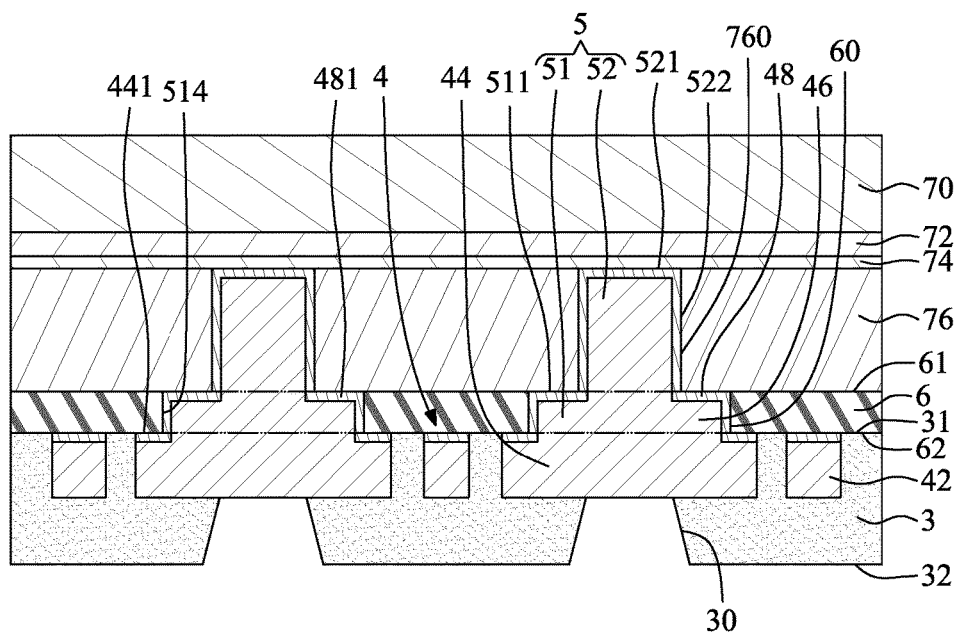
FIG. 20 illustrates one or more stages of an example of a method for manufacturing a substrate structure according to some embodiments of the present disclosure.

Referring to FIG. 20, a dielectric layer 3 is formed or disposed on and covers the first protective layer 6 and the first circuit layer 4. The dielectric layer 3 has a first surface 31 and a second surface 32 opposite to the first surface 31. The first surface 31 of the dielectric layer 3 is disposed on the second surface 62 of the first protective layer 6. The dielectric layer 3 defines an opening 30 that exposes a portion of the bump pad 44 of the first circuit layer 4.

Figure 21:
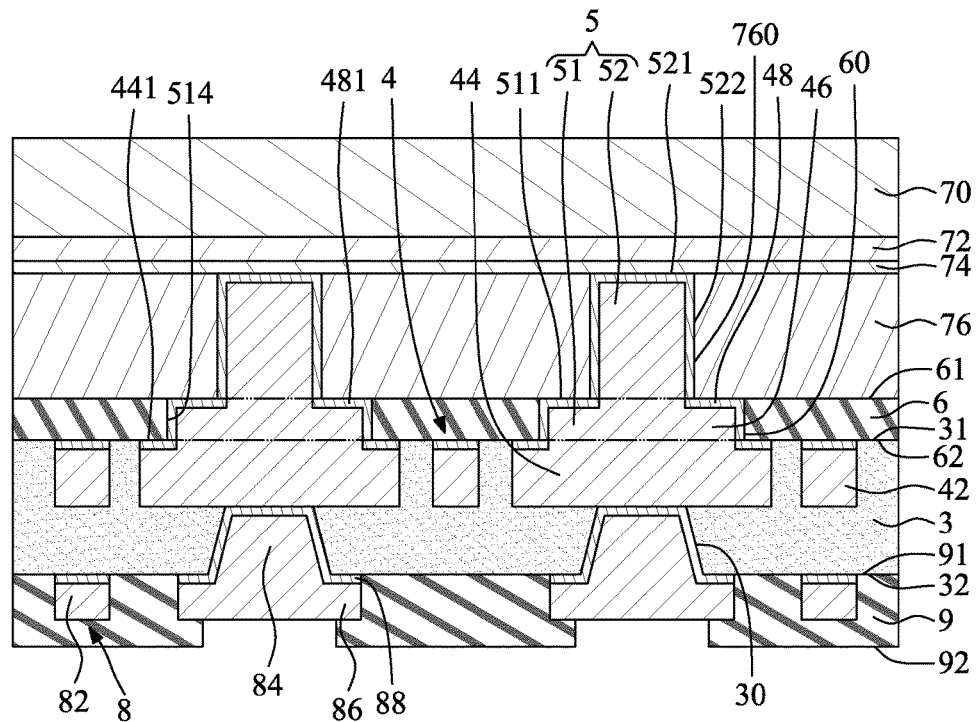
FIG. 21 illustrates one or more stages of an example of a method for manufacturing a substrate structure according to some embodiments of the present disclosure.

Referring to FIG. 21, a second circuit layer 8 is formed on the dielectric layer 3 and in the opening 30 of the dielectric layer 3. The second circuit layer 8 includes a trace 82 and a conductive via 84. The conductive via 84 is disposed in the opening 30 of the dielectric layer 3 and is connected to the bump pad 44 of the first circuit layer 4. In some embodiments, forming the trace 82 and the conductive via 84 of the second circuit layer 8 may include forming a seed layer 88 and a conductive material 86 on the seed layer 88. Then, a second protective layer 9 is formed on the second surface 32 of the dielectric layer 3 and covers at least a portion of the second circuit layer 8. The second protective layer 9 has a first surface 91 and a second surface 92 opposite to the first surface 91. The first surface 91 is disposed on the second surface 32 of the dielectric layer 3. A portion of the conductive via 84 of the second circuit layer 8 is exposed from the second surface 92 of the second protective layer 9.

Figure 22:
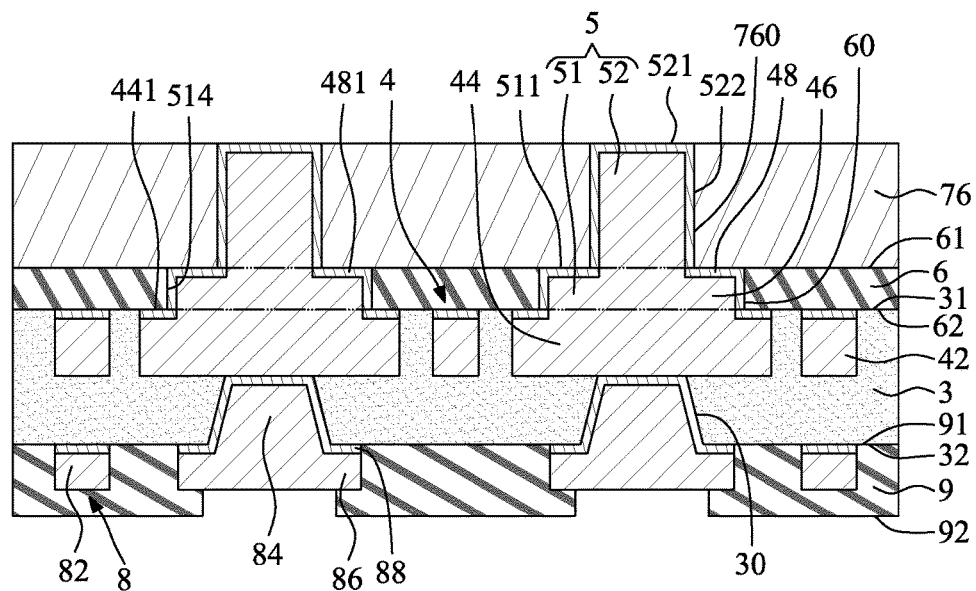
FIG. 22 illustrates one or more stages of an example of a method for manufacturing a substrate structure according to some embodiments of the present disclosure.

Referring to FIG. 22, the carrier 70, the first metal layer 72 and the second metal layer 74 are removed. Then, the first photoresist 76 is removed by, for example, plasma removing or chemical etching techniques. The substrate structure 1b as shown in FIG. 3 is thus formed. During the process for removing the first photoresist 76, a portion of the first protective layer 6 may also be removed. That is, the first protective layer 6 is thinned from the first surface 61 of the first protective layer 6. Accordingly, the first surface 61 of the first protective layer 6 may be slightly recessed from and lower than the upper surface 511 of the first portion 51 of the conductive structure 5.

Figure 23:
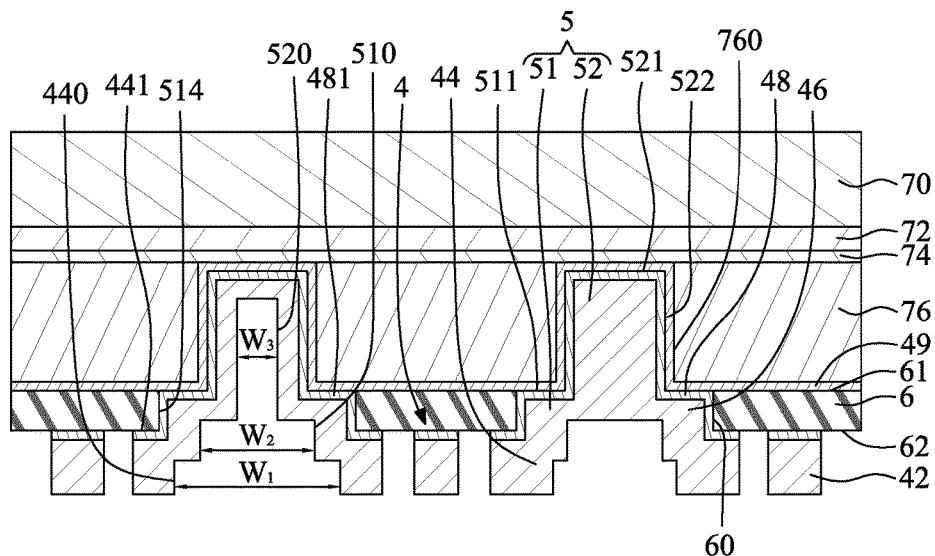
FIG. 23 illustrates one or more stages of an example of a method for manufacturing a substrate structure according to some embodiments of the present disclosure.

FIG. 23, FIG. 24, FIG. 25, FIG. 26, and FIG. 27 illustrate a method for manufacturing a substrate structure according to some embodiments of the present disclosure. In some embodiments, the method is for manufacturing a substrate structure such as the substrate structure 1c shown in FIG. 4. The initial stages of the illustrated process are the same as the stages illustrated in FIG. 7, FIG. 8, FIG. 9, FIG. 10 and FIG. 11. FIG. 23 depicts a stage subsequent to that depicted in FIG. 11.

Referring to FIG. 23, a second portion 52 of a conductive structure 5, a first portion 51 of the conductive structure 5 and a first circuit layer 4 are integrally formed in the first opening 760 of the first photoresist 76, the second opening 60 of the first protective layer 6 and the circuit openings (e.g., the circuit openings 780a and 780b) of the second photoresist 78, respectively. For example, a conductive material 46 is formed or disposed in the first opening 760 of the first photoresist 76, the second opening 60 of the first protective layer 6 and the circuit openings (e.g., the circuit openings 780a and 780b) of the second photoresist 78 by electroplating. Accordingly, the second portion 52 of the conductive structure 5 is formed in the first opening 760 of the first photoresist 76, and the first portion 51 of the conductive structure 5 is formed in the second opening 60 of the first protective layer 6.

However, due to the conditions of the electroplating process, the first opening 760 of the first photoresist 76, the second opening 60 of the first protective layer 6 and the circuit opening (e.g., the circuit opening 780a) of the second photoresist 78 communicating with the second opening 60 may not be completely filled by the conductive material 46. A first hole 440 may be formed in the first circuit layer 4 in the circuit openings 780. A second hole 510 may be formed in the first portion 51 of the conductive structure 5 in the second opening 60. The second hole 510 communicates with the first hole 440 of the first circuit layer 4. A third hole 520 may be formed in the second portion 52 of the conductive structure 5 in the first opening 760. The third hole 520 communicates with the second hole 510 of the first portion 51 of the conductive structure 5. The first hole 440 has a minimum width $W_3$. The second hole 510 has a minimum width $W_4$. The minimum width $W_3$ of the first hole 440 of the first circuit layer 4 is greater than the minimum width $W_4$ of the second hole 510 of the first portion 51 of the conductive structure 5. The third hole 520 has a minimum width $W_5$. The minimum width $W_4$ of the second hole 510 of the first portion 51 of the conductive structure 5 is greater than the minimum width $W_5$ of the third hole 520 of the second portion 52 of the conductive structure 5.

In other words, forming the first circuit layer 4 in the circuit openings 780 includes forming a first hole 440 in the first circuit layer 4 in the circuit openings 780. Forming the first portion 51 of the conductive structure 5 in the second opening 60 includes forming a second hole 510 in the first portion 51 of the conductive structure 5 in the second opening 60, and the second hole 510 communicates with the first hole 440 of the first circuit layer 4. Forming the second portion 52 of the conductive structure 5 in the first opening 760 includes forming a third hole 520 in the second portion 52 of the conductive structure 5 in the first opening 760, and the third hole 520 communicates with the second hole 510 of the first portion 51 of the conductive structure 5.

Then, the second photoresist 78 is removed by, for example, stripping. Portions of the seed layer 48 which are not covered by the conductive material 46 are then removed by, for example, etching. The first circuit layer 4 is thus formed.

Figure 24:
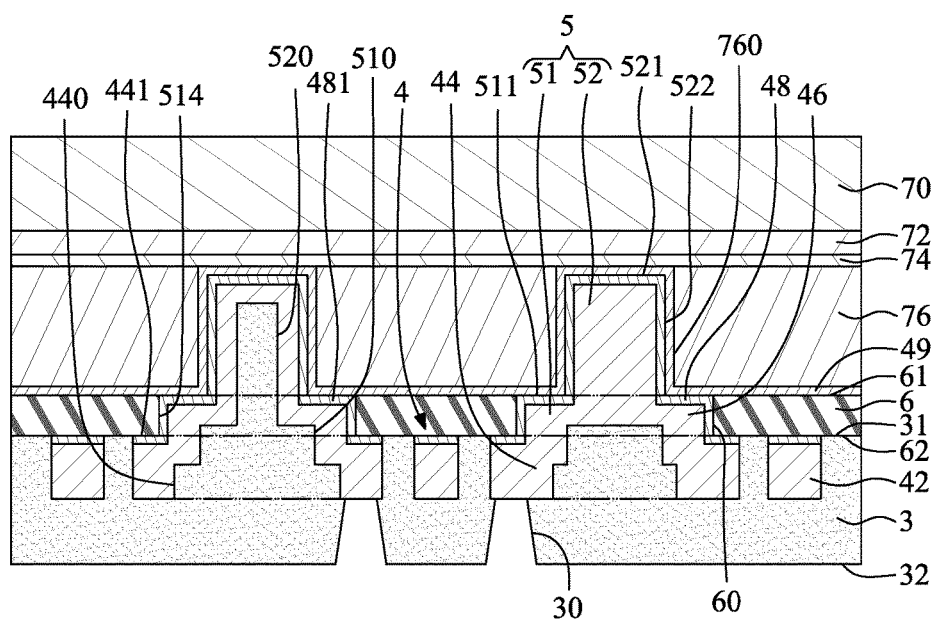
FIG. 24 illustrates one or more stages of an example of a method for manufacturing a substrate structure according to some embodiments of the present disclosure.

Referring to FIG. 24, a dielectric layer 3 is formed or disposed on and covers the first protective layer 6 and the first circuit layer 4. The dielectric layer 3 is filled in the first hole 440 of the circuit layer 4 in the circuit opening (e.g., the circuit opening 780a). The dielectric layer 3 is further filled in the second hole 510 of the first portion 51 of the conductive structure 5 in the second opening 60. In some embodiments, the dielectric layer 3 is further filled in the third hole 520 of the second portion 52 of the conductive structure 5 in the first opening 760. The dielectric layer 3 defines an opening 30 to expose a portion of the first circuit layer 4.

Figure 25:
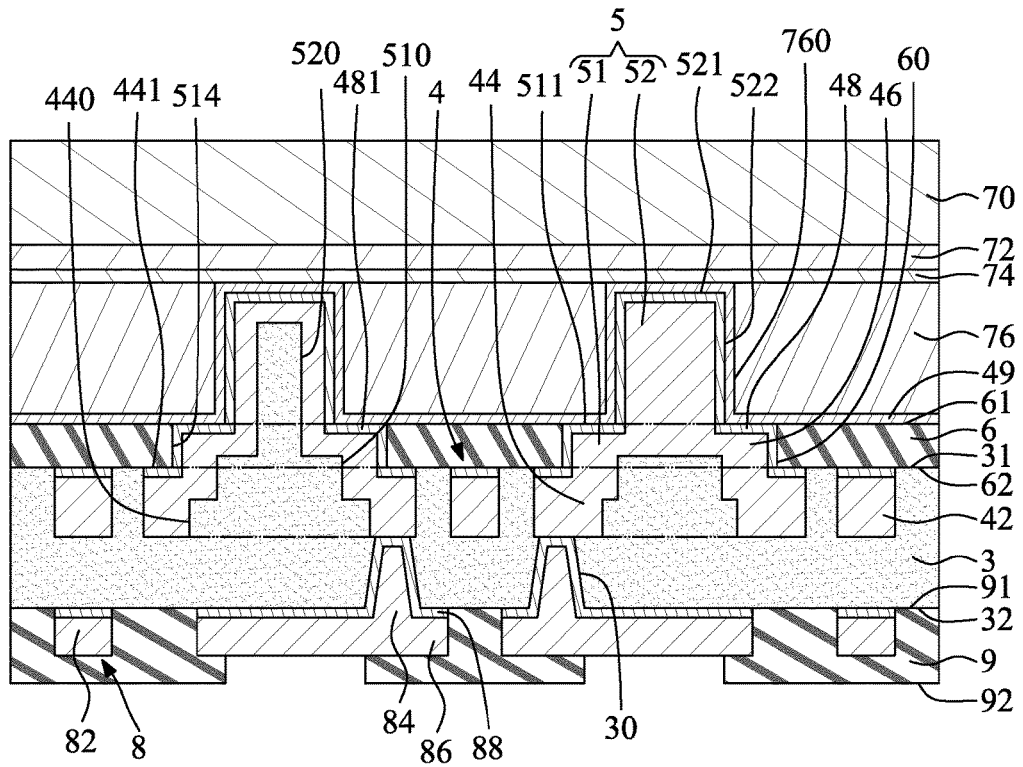
FIG. 25 illustrates one or more stages of an example of a method for manufacturing a substrate structure according to some embodiments of the present disclosure.

Referring to FIG. 25, a second circuit layer 8 is formed on the dielectric layer 3 and in the opening 30 of the dielectric layer 3.

Figure 26:
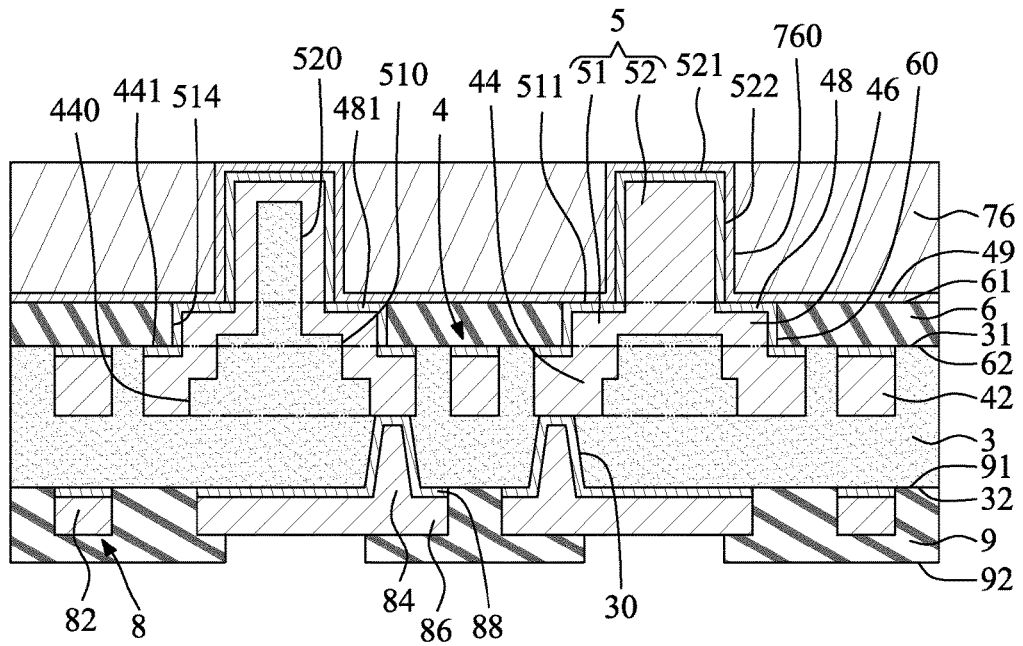
FIG. 26 illustrates one or more stages of an example of a method for manufacturing a substrate structure according to some embodiments of the present disclosure.

Referring to FIG. 26, the carrier 70, the first metal layer 72 and the second metal layer 74 are removed.

Figure 27:
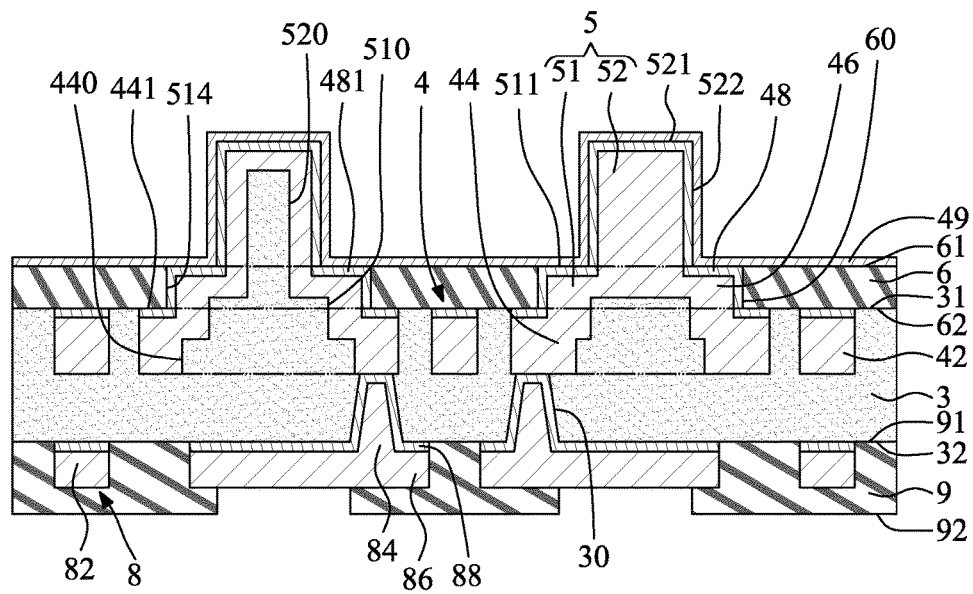
FIG. 27 illustrates one or more stages of an example of a method for manufacturing a substrate structure according to some embodiments of the present disclosure.

Referring to FIG. 27, the first photoresist 76 is removed. Then, an etching process is conducted to remove the auxiliary seed layer 49 on the first protective layer 6 and on the conductive structure 5, to expose the upper surface 521 and the sidewall 522 of the second portion 52 of the conductive structure 5, the upper surface 511 of the first portion 51 of the conductive structure 5, and the first surface 61 of the first protective layer 6. The substrate structure 1c as shown in FIG. 4 is thus formed.

Figure 28:
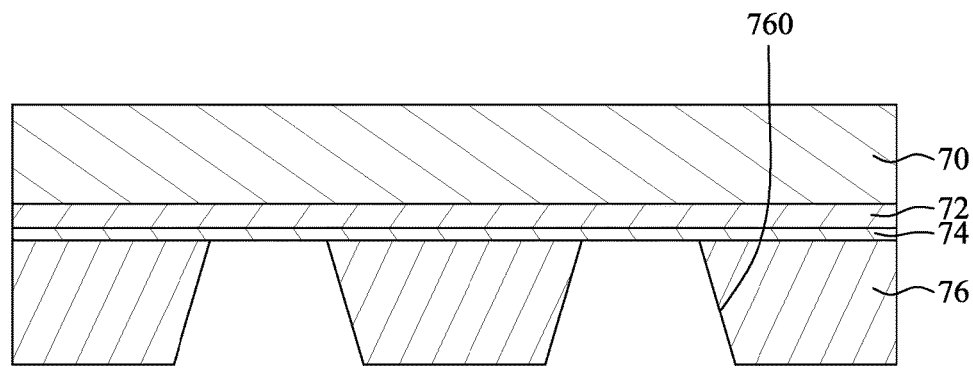
FIG. 28 illustrates one or more stages of an example of a method for manufacturing a substrate structure according to some embodiments of the present disclosure.

FIG. 28, FIG. 29, FIG. 30, FIG. 31, and FIG. 32 illustrate a method for manufacturing a substrate structure according to some embodiments of the present disclosure. In some embodiments, the method is for manufacturing a substrate structure such as the substrate structure 1d shown in FIG. 5. The initial stages of the illustrated process are the same as the stage illustrated in FIG. 7. FIG. 28 depicts a stage subsequent to that depicted in FIG. 7.

Referring to FIG. 28, a first photoresist 76 is formed or disposed on the carrier 70. The first photoresist 76 defines at least one first opening 760. The first opening 760 extends through the first photoresist 76. As shown in FIG. 28, the first opening 760 is in a substantially trapezoidal shape.

Figure 29:
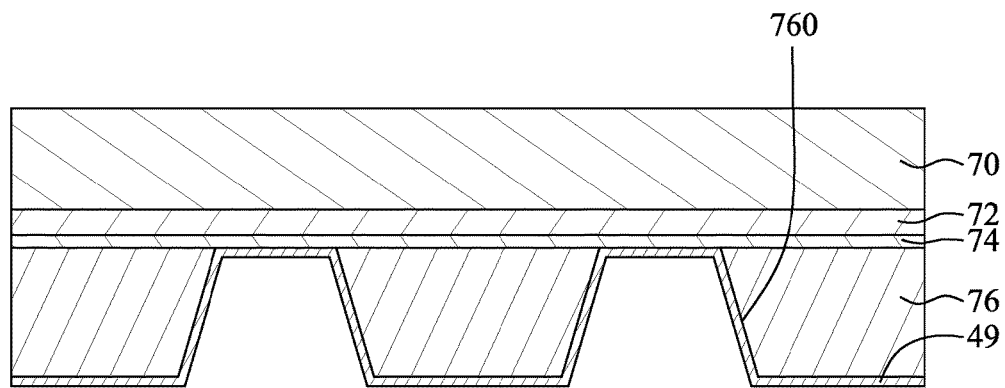
FIG. 29 illustrates one or more stages of an example of a method for manufacturing a substrate structure according to some embodiments of the present disclosure.

Referring to FIG. 29, an auxiliary seed layer 49 is formed or disposed on the first photoresist 76 and in the first opening 760 of the first photoresist 76.

Figure 30:
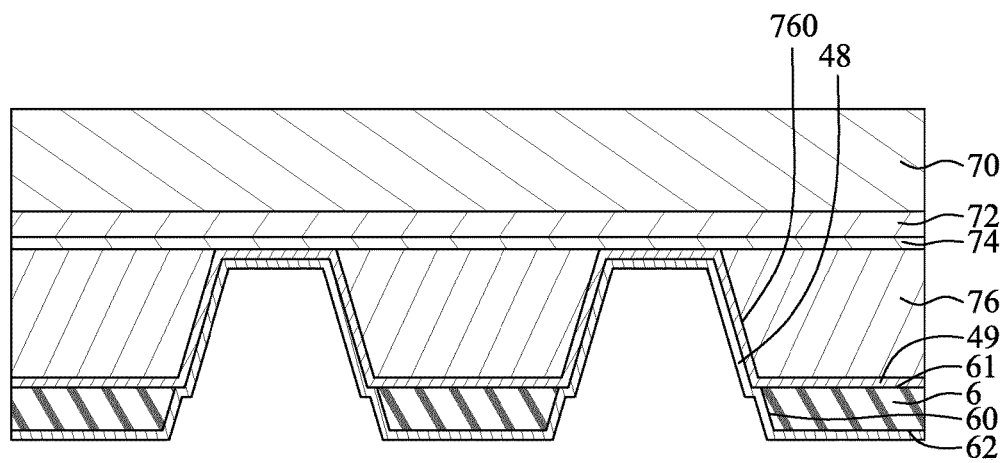
FIG. 30 illustrates one or more stages of an example of a method for manufacturing a substrate structure according to some embodiments of the present disclosure.

Referring to FIG. 30, a first protective layer 6 is formed or disposed on the first photoresist 76 and the auxiliary seed layer 49. The first protective layer 6 defines at least one second opening 60, which communicates with the first opening 760 of the first photoresist 76. The second opening 60 extends through the first protective layer 6. Then, a seed layer 48 is formed or disposed on the first protective layer 6, and in the second opening 60 of the first protective layer 6 and the first opening 760 of the first photoresist 76. For example, the seed layer 48 is formed on the auxiliary seed layer 49 in the second opening 60 of the first protective layer 6 and in the first opening 760 of the first photoresist 76.

Figure 31:
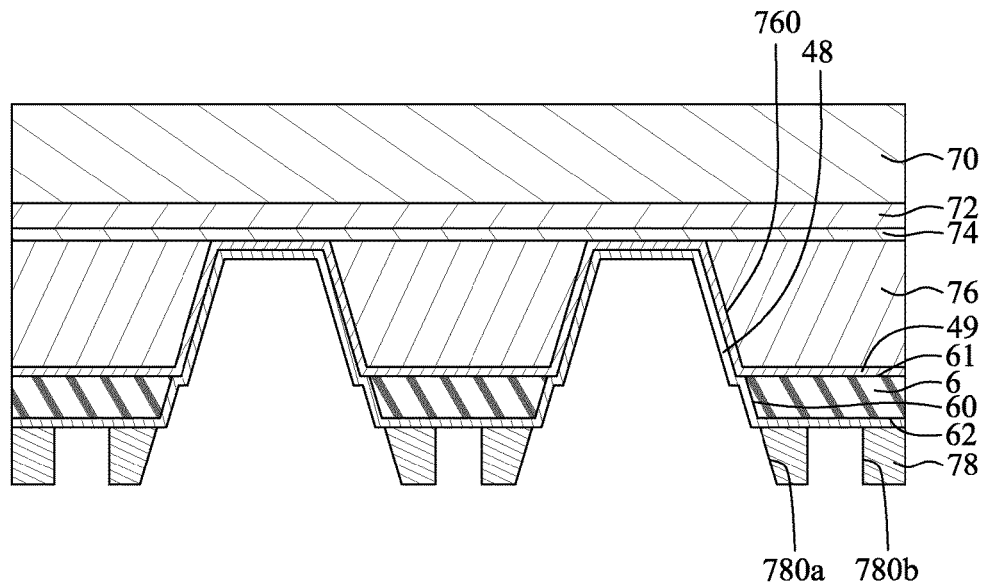
FIG. 31 illustrates one or more stages of an example of a method for manufacturing a substrate structure according to some embodiments of the present disclosure.

Referring to FIG. 31, second photoresist 78 is formed on the first protective layer 6 and the seed layer 48. The second photoresist 78 defines a plurality of circuit openings (e.g., circuit openings 780a and 780b). The circuit openings (e.g., the circuit openings 780a and 780b) extend through the second photoresist 78. At least one of the circuit openings (e.g., the circuit opening 780a) communicates with the second openings 60 of the first protective layer 6. The circuit opening (e.g., the circuit opening 780a) communicating with the second openings 60 of the first protective layer 6 is in a substantially trapezoidal shape. The first opening 760 of the first photoresist 76, the second opening 60 of the first protective layer 6 and the circuit opening 780 of the second photoresist 78 which communicates with the second opening 60 are substantially in a tapered shape. In some embodiments, another one of the circuit openings (e.g., the circuit opening 780b) does not communicate with the second openings 60 of the first protective layer 6.

Figure 32:
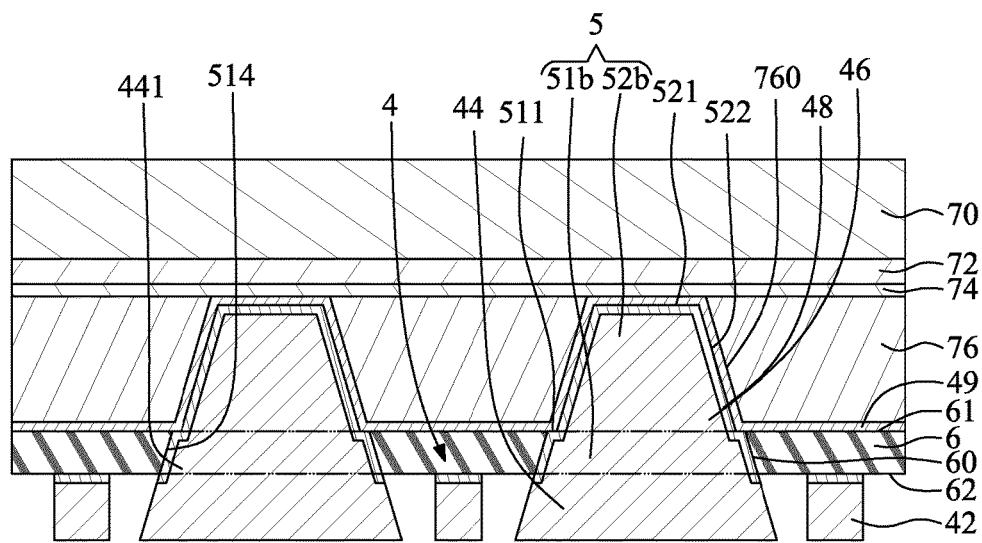
FIG. 32 illustrates one or more stages of an example of a method for manufacturing a substrate structure according to some embodiments of the present disclosure.

Referring to FIG. 32, a second portion 52 of a conductive structure 5, a first portion 51 of the conductive structure 5 and a first circuit layer 4 are integrally formed in the first opening 760 of the first photoresist 76, the second opening 60 of the first protective layer 6 and the circuit openings (e.g., the circuit openings 780a and 780b) of the second photoresist 78, respectively. Then, the second photoresist 78 is removed. Portions of the seed layer 48 which are not covered by the conductive material 46 are then removed.

The stages subsequent to FIG. 32 of the illustrated process are similar to the stages illustrated in FIG. 13, FIG. 14, FIG. 15, and FIG. 16, thus forming the substrate structure 1d as shown in FIG. 5.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Unless otherwise explained herein, two surfaces can be deemed to be coplanar or substantially coplanar if a displacement between the two surfaces is no greater than 15 μm, no greater than 7 μm, no greater than 5 μm, no greater than 3 μm, no greater than 2 μm, no greater than 1 μm, or no greater than 0.5 μm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A substrate structure, comprising:
a dielectric layer;
a first circuit layer disposed adjacent to a first surface of the dielectric layer;
at least one conductive structure including a first portion and a second portion, wherein the first portion is disposed on the first circuit layer, and the first portion includes a seed layer and a conductive material; and
a first protective layer disposed on the dielectric layer and contacting at least a portion of a sidewall of the first portion of the conductive structure, wherein the first circuit layer and the conductive structure are integrally formed, and the seed layer of the first portion of the conductive structure is disposed between the conductive material and the first protective layer.

2. The substrate structure of claim 1, wherein the at least one conductive structure includes a plurality of conductive structures each including a first portion and a second portion, upper surfaces of the second portions of the conductive structures are substantially coplanar, and each of the second portions of the conductive structures protrudes from an upper surface of the first protective layer.

3. The substrate structure of claim 1, wherein an upper surface of the first protective layer is not at the same level as an upper surface of the first portion of the conductive structure.

4. The substrate structure of claim 3, wherein the upper surface of the first protective layer is recessed from the upper surface of the first portion of the conductive structure.

5. The substrate structure of claim 3, wherein the upper surface of the first protective layer protrudes above the upper surface of the first portion of the conductive structure.

6. The substrate structure of claim 1, wherein the first portion of the conductive structure and the second portion of the conductive structure are integrally formed, and a minimum width of the first portion of the conductive structure is greater than a minimum width of the second portion of the conductive structure.

7. The substrate structure of claim 1, wherein the first circuit layer includes at least one bump pad, and the first portion of the conductive structure is disposed on the bump pad of the first circuit layer.

8. The substrate structure of claim 7, wherein the bump pad of the first circuit layer defines at least one first hole, and the dielectric layer fills at least a portion of the first hole.

9. The substrate structure of claim 8, wherein the first portion of the conductive structure defines at least one second hole communicating with the first hole of the bump pad of the first circuit layer, and the dielectric layer fills at least a portion of the second hole.

10. The substrate structure of claim 9, wherein the second portion of the conductive structure defines at least one third hole communicating with the second hole of the first portion of the conductive structure, and the dielectric layer fills at least a portion of the third hole.

11. The substrate structure of claim 10, wherein a minimum width of the first hole of the bump pad of the first circuit layer is greater than a minimum width of the second hole of the first portion of the conductive structure.

12. The substrate structure of claim 11, wherein a minimum width of the second hole of the first portion of the conductive structure is greater than a minimum width of the third hole of the second portion of the conductive structure.

13. A semiconductor package, comprising:
a substrate structure, including:
a dielectric layer;
a first circuit layer disposed adjacent to a first surface of the dielectric layer, wherein the first circuit layer comprises at least one bump pad;
a conductive structure including a first portion and a second portion, wherein the first portion is disposed on the at least one bump pad of the first circuit layer; and
a first protective layer disposed on the first circuit layer and the dielectric layer, and contacting at least a portion of a sidewall of the first portion of the conductive structure, wherein the first circuit layer and the conductive structure are integrally formed;
a semiconductor die, disposed on the substrate structure and electrically connected to the second portion of the conductive structure; and
an encapsulant covering the semiconductor die and the substrate structure.

14. The semiconductor package of claim 13, wherein the first protective layer has an upper surface and the first portion of the conductive structure has an upper surface, and the upper surface of the first protective layer is not coplanar with the upper surface of the first portion of the conductive structure.

15. The semiconductor package of claim 13, wherein the first portion of the conductive structure and the second portion of the conductive structure are integrally formed, and a minimum width of the first portion of the conductive structure is greater than a minimum width of the second portion of the conductive structure.

16. The semiconductor package of claim 13, wherein the at least one bump pad of the first circuit layer defines at least one first hole, and the dielectric layer fills at least a portion of the at least one first hole.

17. The semiconductor package of claim 16, wherein the first portion of the conductive structure defines at least one second hole communicating with the at least one first hole of the at least one bump pad of the first circuit layer, and the dielectric layer fills at least a portion of the at least one second hole.

18. The semiconductor package of claim 17, wherein the second portion of the conductive structure defines at least one third hole communicating with the at least one second hole of the first portion of the conductive structure, and the dielectric layer fills at least a portion of the at least one third hole.

* * * * *